(12) United States Patent
Ogiwara et al.

(10) Patent No.: US 9,607,693 B2
(45) Date of Patent: Mar. 28, 2017

(54) SEMICONDUCTOR STORAGE DEVICE

(71) Applicant: KABUSHIKI KAISHA TOSHIBA, Minato-ku (JP)

(72) Inventors: Ryu Ogiwara, Yokohama (JP); Daisaburo Takashima, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/880,458

(22) Filed: Oct. 12, 2015

(65) Prior Publication Data
US 2016/0267969 A1 Sep. 15, 2016

Related U.S. Application Data

(60) Provisional application No. 62/130,294, filed on Mar. 9, 2015.

(51) Int. Cl.
*G11C 5/06* (2006.01)
*G11C 13/00* (2006.01)

(52) U.S. Cl.
CPC ........ *G11C 13/004* (2013.01); *G11C 13/0004* (2013.01); *G11C 13/0069* (2013.01); *G11C 2013/0054* (2013.01)

(58) Field of Classification Search
CPC .............. G11C 13/004; G11C 13/0004; G11C 13/0069; G11C 2013/0054
USPC ...... 365/63, 185.21, 148, 163, 158, 189.011, 365/189.14, 189.15, 189.07, 202, 207, 365/210.15
See application file for complete search history.

(56) References Cited

U.S. PATENT DOCUMENTS

| | | | |
|---|---|---|---|
| 8,144,499 B2 | 3/2012 | Kitagawa et al. | |
| 2010/0182820 A1* | 7/2010 | Kitagawa | G11C 11/56 365/148 |
| 2013/0088911 A1 | 4/2013 | Nakura et al. | |

FOREIGN PATENT DOCUMENTS

| | | |
|---|---|---|
| JP | 2010-170617 | 8/2010 |
| JP | 2011-204358 | 10/2011 |
| JP | 2013-084324 | 5/2013 |

OTHER PUBLICATIONS

Junji Tominaga, et al., "Electrical-field induced giant magnetoresistivity in (non-magnetic) phase change films", Applied Physics Letters, (99), 2011, 4 pgs.

Tz-Yi Liu, et al., "A 130.7mm2 2-Layer 32Gb ReRAM Memory Device in 24nm Technology", IEEE International Solid-State Circuits Conference, Session 12, 2013, 3 pgs.

(Continued)

*Primary Examiner* — Fernando Hidalgo
(74) *Attorney, Agent, or Firm* — Oblon, McClelland, Maier & Neustadt, L.L.P.

(57) ABSTRACT

A semiconductor storage device according to the present embodiments includes a first bit line and a first word line. A resistance-change memory element is connected to the first bit line and the first word line. A sense node is connected to the first bit line in a data read operation. A first transistor is connected between the sense node and the first bit line. A second transistor connects the first bit line and a power supply to each other in a data write operation. A first operational amplifier has one input connected to the first bit line, other input receiving a reference voltage, and an output connected in common to a gate of the first transistor and a gate of the second transistor. A sense circuit is connected to the sense node.

20 Claims, 15 Drawing Sheets

(56) References Cited

OTHER PUBLICATIONS

Youngdon Choi, et al., "A 20nm 1.8V 8Gb PRAM with 40MB/s Program Bandwidth", IEEE International Solid-State Circuits Conference, Session 2, 2012, 3 pgs.

Satoru Hanzawa, et al., "A 512kB Embedded Phase Change Memory with 416kB/s Write Throughput at 100 µA Cell Write Current", IEEE International Solid-State Circuits Conference, Session 26, 2007, 3 pgs.

* cited by examiner

SEMICONDUCTOR STORAGE DEVICE

CROSS REFERENCE TO RELATED APPLICATIONS

This application is based upon and claims the benefit of priority from the prior U.S. provisional Patent Application No. 62/130,294, filed on Mar. 9, 2015, the entire contents of which are incorporated herein by reference.

FIELD

The embodiments of the present invention relate to a semiconductor storage device.

BACKGROUND

Semiconductor storage devices such as a NAND flash memory have been downscaled to increase storage capacity thereof. To realize further downscaling, development of memories using new materials is being progressed. For example, novel memories such as a ReRAM (Resistance Random Access Memory), a PRAM (Phase-change RAM), a PCM (Phase-Change Memory), an iPCM (interfacial PCM), a FeNAND (Ferroelectric NAND-type memory), and an MRAM (Magnetic Random Access Memory) are developed.

Among these novel memories, the PCM and the iPCM are brought to a low-resistance state (a set state) or a high-resistance state (a reset state) due to phase transition of a phase-change film of a memory cell. This enables the PCM and the iPCM to store therein logical data.

However, in a conventional PCM and a conventional iPCM, a write circuit and a read circuit are provided separately without sharing a common configuration. Data is written to the PCM and the iPCM by causing a current to flow in a memory cell. Because the cell current flows even after write of the data is completed, the current is wasted correspondingly. When the cell current flows after completion of write of data, reliability may be degraded due to excessive write operations.

DETAILED DESCRIPTION

Embodiments will now be explained with reference to the accompanying drawings. The present invention is not limited to the embodiments.

A semiconductor storage device according to the present embodiments includes a first bit line and a first word line. A resistance-change memory element is connected to the first bit line and the first word line. A sense node is connected to the first bit line in a data read operation. A first transistor is connected between the sense node and the first bit line. A second transistor connects the first bit line and a power supply to each other in a data write operation. A first operational amplifier has one input connected to the first bit line, other input receiving a reference voltage, and an output connected in common to a gate of the first transistor and a gate of the second transistor. A sense circuit is connected to the sense node.

The following embodiments can be applied to any one of current-detection memories such as a ReRAM, a PRAM, a PCM, an iPCM, a FeNAND, and an MRAM.

(First Embodiment)

Figure 1:
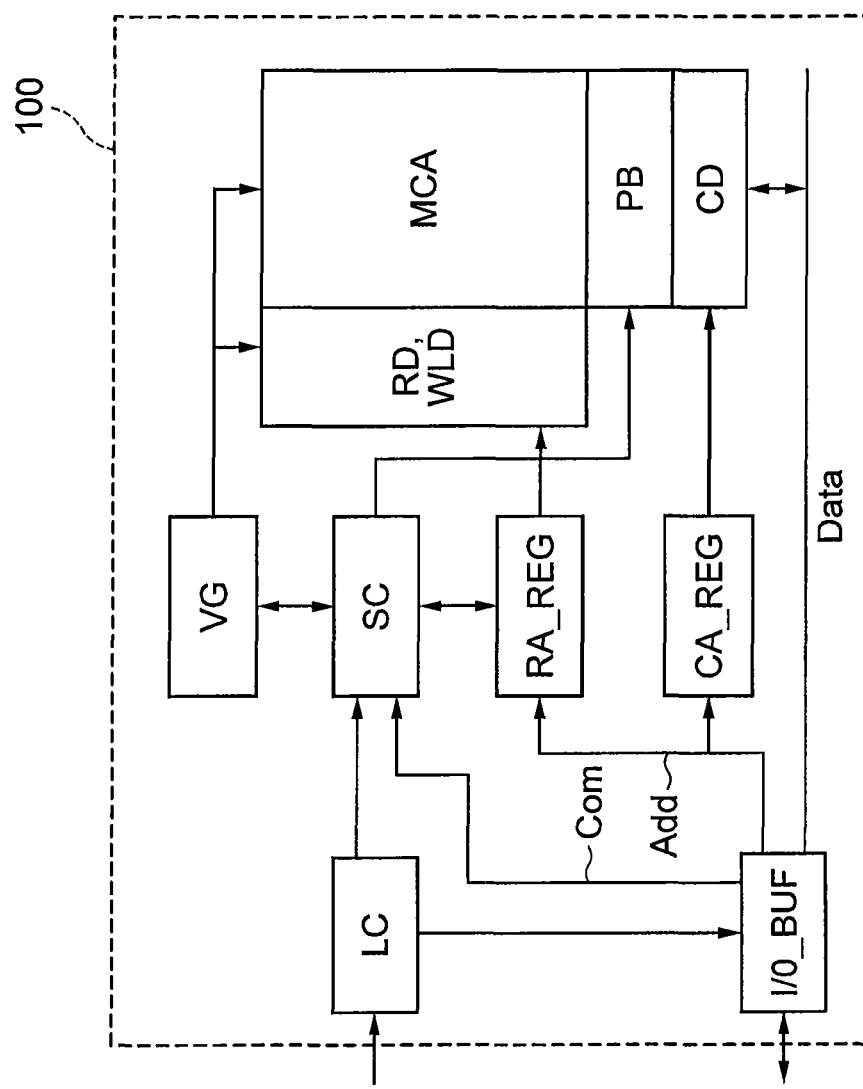
FIG. 1 is a block diagram showing an example of a configuration of a memory 100 according to a first embodiment.

FIG. 1 is a block diagram showing an example of a configuration of a memory 100 according to a first embodiment. The memory 100 includes a memory cell array MCA, a page buffer PB, a column decoder CD, a word line driver WLD, a row decoder RD, an internal-voltage generation circuit VG, a sequence controller SC, a logic controller LC, a row address register RA_REG, a column address register CA_REG, and an input/output (I/O) buffer I/O_BUF. The internal-voltage generation circuit VG includes a step-up circuit that generates a step-up potential higher than that of an external power supply VDD with a charge pump circuit, a source-follower step-down transistor, a circuit that generates an internal step-down potential from that of the external power supply VDD with a PMOS (P-type Metal-Oxide-Semiconductor) feedback circuit, a BGR (Band-Gap-Reference) circuit serving as a reference-potential generation circuit that generates a constant potential regardless of temperatures and power supply voltages, a power-on detection circuit that detects rising of the external power supply potential to a value equal to or larger than a certain value, and the like. In FIG. 1, arrows from VG indicating the step-up potential that is supplied to the memory cell array MCA, the row decoder RD, and the word line driver WLD are explicitly shown. A step-down potential is supplied to the page buffer PB, the column decoder CD, the sequence controller SC, the row address register RA_REG, and the column address register CA_REG.

The memory cell array MCA includes a plurality of memory cells MC arranged two-dimensionally in a matrix. The row decoder RD and the word line driver WLD selectively step up or drive one of word lines of the memory cell array MCA.

The column decoder CD and the page buffer PB read data of a memory cell MC via a selected bit line or bit line pair and temporarily store therein the read data. Alternatively, the column decoder CD and the page buffer PB temporarily store therein write data and write the write data to a memory cell MC via a selected bit line or bit line pair. The page buffer PB includes a sense amplifier circuit and a data retention circuit and performs read and write of data in units of pages of the memory cell array MCA. The column decoder CD transfers the read data stored in the page buffer PB to the I/O buffer I/O_BUF column by column. Alternatively, the column decoder CD transfers the write data transferred from the I/O buffer I/O_BUF to the page buffer PB column by column.

The row address register RA_REG receives a row address signal via the I/O buffer I/O_BUF and retains the row address signal therein. The column address register CA_REG receives a column address signal via the I/O buffer I/O_BUF and retains the column address signal therein. The row address register RA_REG and the column address register CA_REG transfer the row address signal and the column address signal (hereinafter, also "address signal Add") to the row decoder RD and the column decoder CD, respectively.

Based on a control signal (hereinafter, also "command Com") such as a chip enable signal, a command enable signal, an address-latch enable signal, a write enable signal, or a read enable signal, the logic controller LC controls input of the command Com or the address signal Add and also controls input/output of data Data (read data or write data). A read operation or a write operation is performed according to the command Com. Upon reception of the command Com, the sequence controller SC executes sequence control on read, write, or erase.

The internal-voltage generation circuit VG is controlled by the sequence controller SC and generates or supplies predetermined voltages required for various operations.

The I/O buffer I/O_BUF outputs the read data from the column decoder CD to outside or transfers the write data from outside to the column decoder CD. The I/O buffer I/O_BUF also receives the command Com and the address signal Add.

Figure 2:
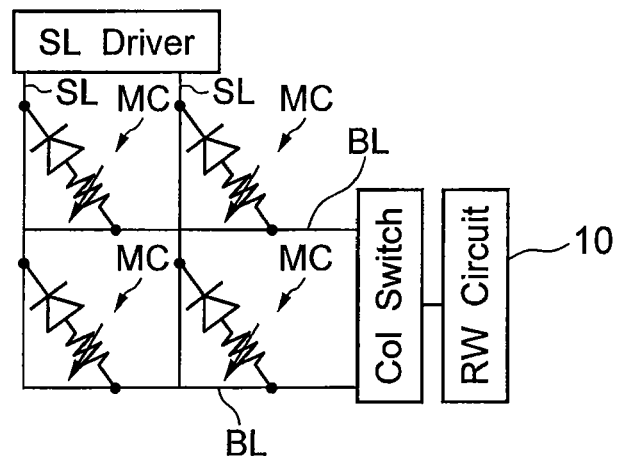
FIG. 2 shows an example of diode memory cells of an iPCM.

FIG. 2 shows an example of diode memory cells of an iPCM. Each of memory cells MC includes a memory element and a diode connected in series between one of bit lines BL and one of source lines SL. The diodes are connected to allow a current to flow from the corresponding bit lines BL to the corresponding source lines SL, respectively. The source lines SL are connected to a source line driver and the bit lines BL are connected to a read/write circuit 10 via a column switch. The source line driver can selectively drive the source lines SL. The column switch can selectively connect one of the bit lines BL to the read/write circuit 10.

For example, the read/write circuit 10 sets the potential of a bit line BL connected to a memory cell MC selected at the time of write of a high-resistance state (a reset state) at, for example, 1.4 volts. At that time, the source line driver sets the potential of a source line SL connected to the selected memory cell MC at, for example, 0 volt. Accordingly, a forward bias voltage of, for example, 1.4 volts is applied to the diode of the selected memory cell MC and a current from the read/write circuit 10 flows in the selected memory cell MC. Meanwhile, unselected source lines SL are set at, for example, 0.9 volt and unselected bit lines BL are set at, for example, 0 volt. This causes a reverse bias voltage of 0.9 volt to be applied to the diodes of memory cells MC connected to the unselected bit lines BL and the unselected source lines SL. Therefore, in this case, no current flows in the memory cells MC. A forward bias voltage of 0.5 volt is applied to memory cells MC connected to the selected bit line BL and the unselected source lines SL. In this case, the forward bias voltage (0.5 volt) is set not to exceed a built-in potential (0.6 volt) of the diodes of the memory cells MC. Accordingly, no current flows in unselected memory cells MC.

Figure 3:
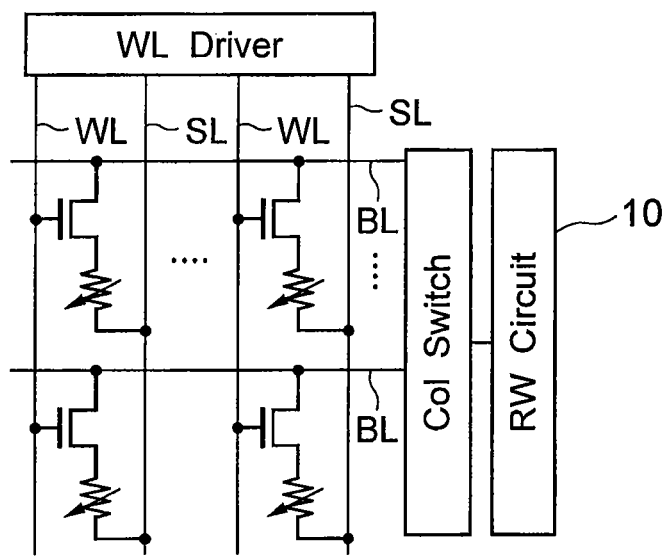
FIG. 3 shows an example of transistor memory cells of an iPCM.

FIG. 3 shows an example of transistor memory cells of an iPCM. Each of memory cells MC includes a memory element and a transistor connected in series between one of bit lines BL and one of source lines SL. Gates of the transistors are connected to word lines WL, respectively. The word lines WL are connected to a word line driver and the bit lines BL are connected to the read/write circuit 10 via a column switch. Source lines SL are connected to a low-level voltage source VSS (a low-level voltage VSS) (not shown).

With this configuration, the read/write circuit 10 enables a current to flow in a memory cell MC selected by one of the word lines WL and one of the bit lines BL at the time of read or write.

When a current flows in a memory cell MC in the PCM or the iPCM, a phase-change film of the memory cell MC causes phase transition, thereby bringing the PCM element or the iPCM element to a low-resistance state (a set state) or a high-resistance state (a reset state). This enables the PCM or the iPCM to store therein logical data. For example, when the low-resistance state (the set state) is "0" data and the high-resistance state (the reset state) is "1" data, the PCM or the iPCM can store therein "0" and "1".

Figure 4:
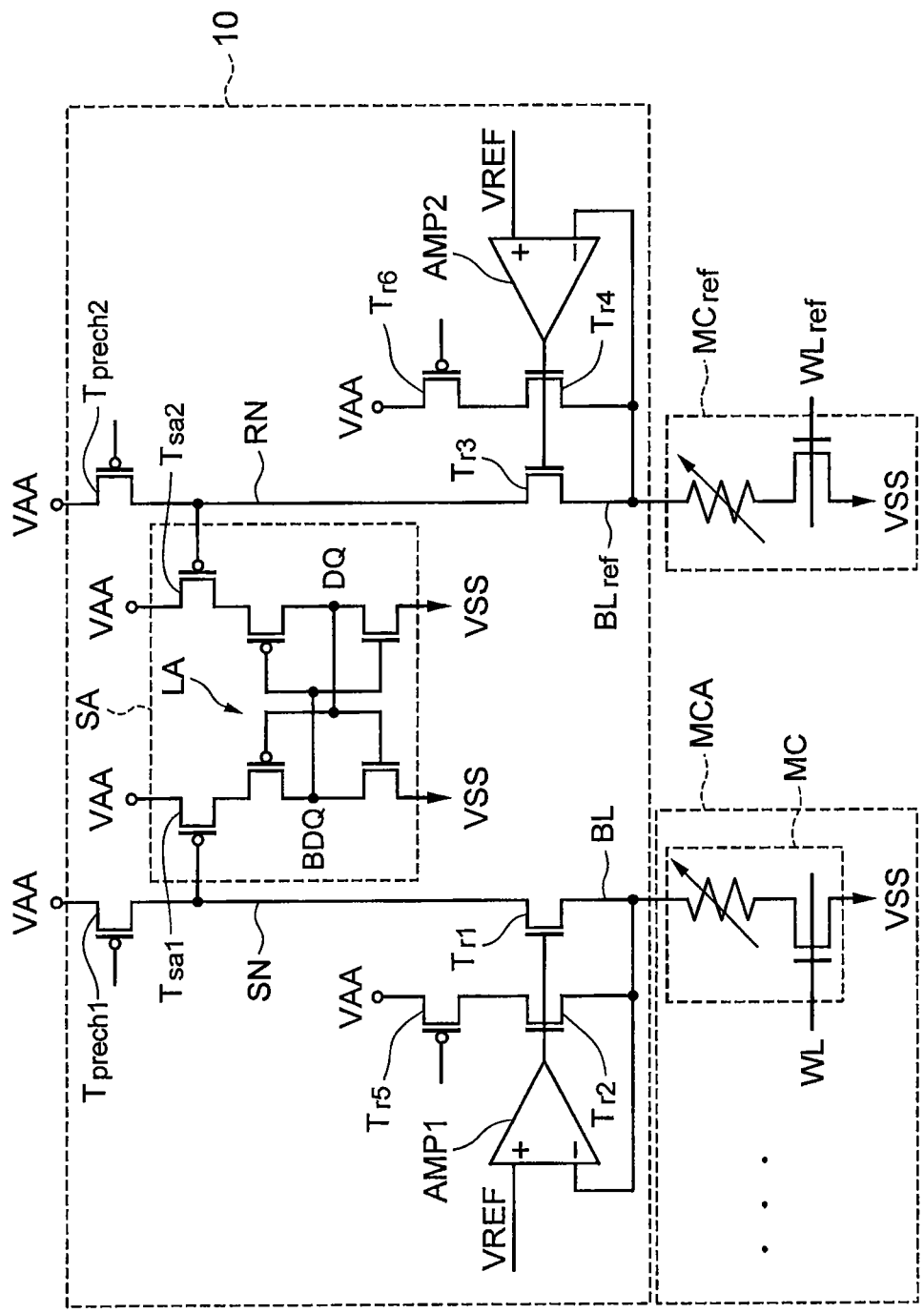
FIG. 4 is a circuit diagram showing an example of configurations of the read/write circuit 10, the memory cells MC, and a reference cell MCref in the memory 100 according to the first embodiment.

FIG. 4 is a circuit diagram showing an example of configurations of the read/write circuit 10, the memory cells MC, and a reference cell MCref in the memory 100 according to the first embodiment. The read/write circuit 10 is incorporated in the page buffer PB in FIG. 1 and constituent elements of the read/write circuit 10 operate, for example, under control of the sequence controller SC in FIG. 1. The column switch is not shown in FIG. 4.

The read/write circuit 10 includes bit lines (first bit lines) BL, a reference bit line (second bit line) BLref, first to sixth transistors Tr1 to Tr6, a first precharge transistor Tprech1, a second precharge transistor Tprech2, a first operational amplifier AMP1, a second operational amplifier AMP2, and a sense circuit SA.

Figure 16:
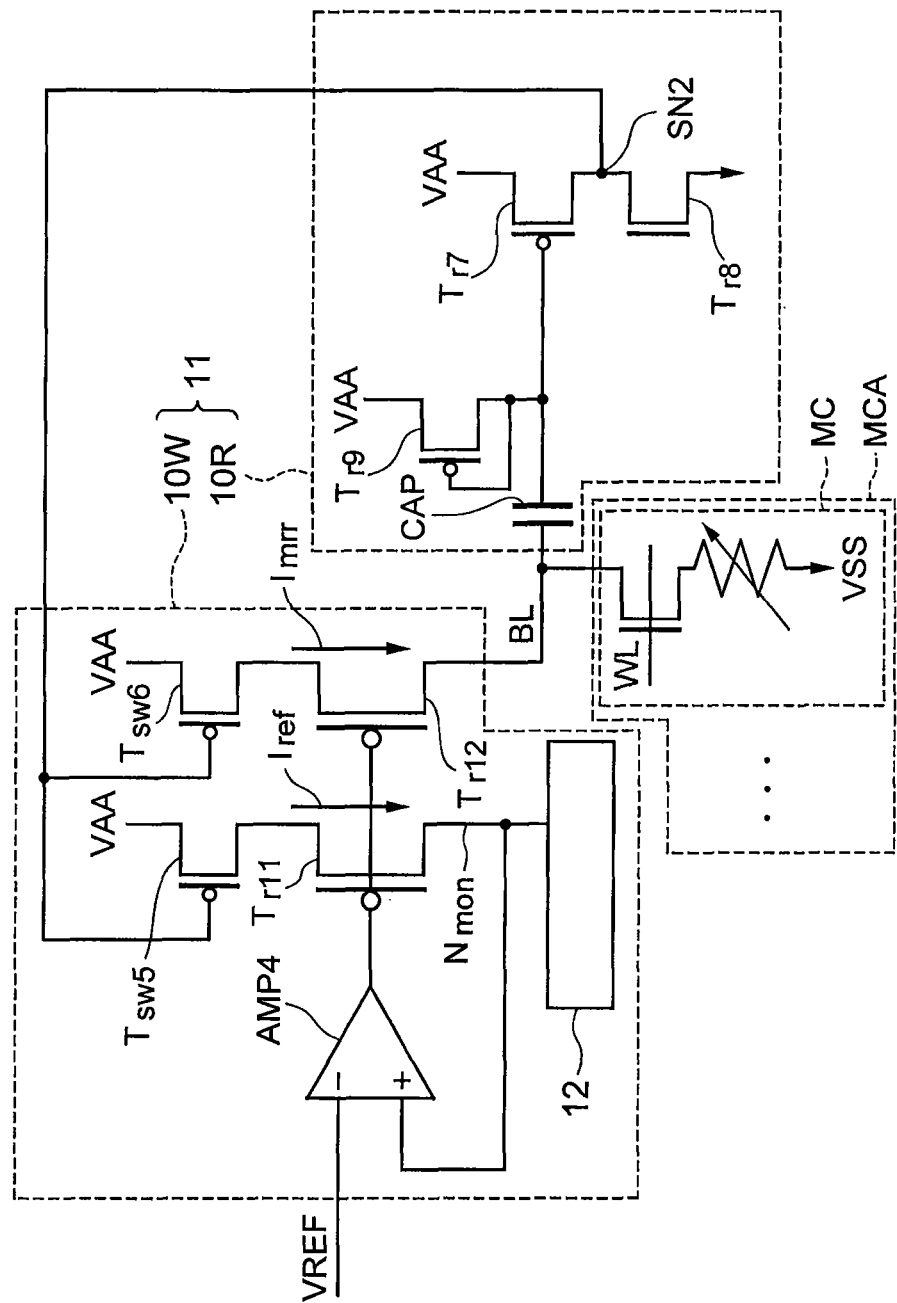
FIG. 16 is a circuit diagram showing an example of configurations of a write circuit that writes the Set state according to a seventh embodiment.

FIG. 16 shows another embodiment of the sense circuit. The sense circuit shown in FIG. 16 may be used instead of that shown in FIG. 4. The sense circuit shown in FIG. 16 can surely latch data corresponding to voltages of nodes SA and BSA, because data of the nodes DQ and BDQ is reset to 0V before latching the data of the nodes SA and BSA in a data read operation or in a verify read operation of a data write operation. In the verify read operation, the sense circuit cannot execute reading of data and writing of data at the same time, because the DQ and BDQ has to be reset to 0V when the verify reading is executed after writing of data. However, it is possible to reduce the layout area of the sense circuit, since operation amplifier in the sense circuit is used in the both of the verify reading and the writing of data.

The first transistor Tr1 is an N-type transistor and is connected between the bit lines BL and a sense node SN. A gate of the first transistor Tr1 is connected to an output of the first operational amplifier AMP1. The first precharge transistor Tprech1 is connected between a power supply VAA and the sense node SN. The first transistor Tr1 is an N-type transistor and the first precharge transistor Tprech1 is a P-type transistor. The first transistor Tr1 and the first precharge transistor Tprech1 are used to supply a current to a memory cell MC in a data read operation.

The power supply VAA is an internal step-down power-supply voltage generated from the voltage of the external power supply VDD using the BGR circuit and the step-down circuit and supplied to the memory cell array MCA and is a substantially constant voltage regardless of changes in the temperature and the external power supply voltages VDD.

The second transistor Tr2 and the fifth transistor Tr5 are connected in series between the power supply VAA and the bit lines BL. The second transistor Tr2 is an N-type transistor and the fifth transistor Tr5 is a P-type transistor. A gate of the second transistor Tr2 is connected in common to the output of the first operational amplifier AMP1 with the gate of the first transistor Tr1. The second transistor Tr2 and the fifth transistor Tr5 are used to supply a current to a memory cell MC in a data write operation.

The current flowing in a memory cell MC at the time of data write is larger than that flowing in a memory cell MC at the time of data read. Therefore, the size (a channel width W×a channel length L) of the second transistor Tr2 is larger than that of the first transistor Tr1.

An inverting input of the first operational amplifier AMP1 is connected to the bit lines BL and a non-inverting input thereof is connected to a reference voltage VREF. The output of the first operational amplifier AMP1 is connected in common to the gates of the first and second transistors Tr1 and Tr2. The first operational amplifier AMP1 controls a conduction state of the first or second transistor Tr1 or Tr2 to set the voltage of a bit line BL to be equal to the reference voltage VREF in the data read operation or the data write operation. The first operational amplifier AMP1 is provided in common for both the first and second transistors Tr1 and Tr2 and operates in both the data read operation and the data write operation. Because currents caused to flow in a memory cell MC and voltages applied thereto are different between the data read operation and the data write operation, the reference voltage VREF differs between the data read operation and the data write operation.

The third transistor Tr3 is an N-type transistor and is connected between the reference bit line BLref and a reference node RN. A gate of the third transistor Tr3 is connected to an output of the second operational amplifier AMP2. The second precharge transistor Tprech2 is a P-type transistor and is connected between the power supply VAA and the reference node RN. The third transistor Tr3 and the second precharge transistor Tprech2 are used to supply a current to the reference cell MCref in the data read operation.

The fourth transistor Tr4 and the sixth transistor Tr6 are connected in series between the power supply VAA and the reference bit line BLref. The fourth transistor Tr4 is an N-type transistor and the sixth transistor Tr6 is a P-type transistor. A gate of the fourth transistor Tr4 is connected in common to the output of the second operational amplifier AMP2 with the gate of the third transistor Tr3. The fourth transistor Tr4 and the sixth transistor Tr6 are used to supply a current to the reference cell MCref in the data write operation.

The size and threshold voltage of the third transistor Tr3 are equal to those of the first transistor Tr1. The size and threshold voltage of the fourth transistor Tr4 are equal to those of the second transistor Tr2. Accordingly, characteristics of a circuit (the transistors Tr1, Tr2, Tr5, Tprech1, and the like) that supplies a current to a memory cell MC are equal to those of a circuit (the transistors Tr3, Tr4, Tr6, Tprech2, and the like) that supplies a current to the reference cell MCref and the characteristics of these circuits are symmetrical. As a result, the sense circuit SA can correctly compare data of a memory cell MC with reference data of the reference cell MCref. In this case, "equal" does not necessarily mean only that the threshold voltages and the characteristics completely match with each other but also means that an error due to manufacturing variation or the like is acceptable.

An inverting input of the second operational amplifier AMP2 is connected to the reference bit line BLref and a non-inverting input thereof is connected to the reference voltage VREF. The output of the second operational amplifier AMP2 is connected in common to the gates of the third and fourth transistors Tr3 and Tr4. The second operational amplifier AMP2 controls a conduction state of the third or fourth transistor Tr3 or Tr4 to set the voltage of the reference bit line BLref to be equal to the reference voltage VREF in the data read operation or the data write operation. The second operation amplifier AMP2 is provided in common for both the third and fourth transistors Tr3 and Tr4 and operates in both the data read operation and the data write operation. Because currents caused to flow in the reference cell MCref and voltages applied thereto are different between the data read operation and the data write operation, the reference voltage VREF differs between the data read operation and the data write operation.

In the above explanations, the read operation and the write operation are performed separately and optimized individually and thus the reference voltage VREF in the read operation and the reference voltage VREF in the write operation are different from each other. On the other hand, in a system that performs a read operation while performing a write operation as explained below, a reference voltage in the write operation is used commonly as the reference voltage VREF.

The sense circuit SA is connected between the sense node SN and the reference node RN and includes a latch circuit LA and sense transistors Tsa1 and Tsa2. The latch circuit LA is configured to be capable of holding data complementary with each other at nodes DQ and BDQ, respectively. The sense transistor Tsa1 is a P-type transistor (MOSFET) and is inserted/connected into/to between the latch circuit LA and the power supply VAA. A gate of the sense transistor Tsa1 is connected to the sense node SN. The sense transistor Tsa2 is a P-type transistor and is inserted/connected into/to between the latch circuit LA and the power supply VAA. A gate of the sense transistor Tsa2 is connected to the reference node RN.

The sense transistors Tsa1, Tsa2 may be N-type transistors (not shown). In this example, the sense transistor Tsa1 is connected between the voltage source VSS and one of the N-type transistors of the latch circuit Lam, and the sense transistor Tsa2 is connected between the voltage source VSS and the other of the N-type transistors of the latch circuit LA. Therefore, the drain of the sense transistor Tsa1 is connected to the source of the one of the N-type transistors, the drain of the sense transistor Tsa2 is connected to the source of the other of the N-type transistors.

A memory cell MC in the memory cell array MCA is connected between the corresponding bit line BL and a low-level voltage source VSS. A gate of a cell transistor of the memory cell MC is connected to the corresponding word line WL. A memory element of a memory cell MC selected by a bit line (first bit line) BL and a word line (first word line) WL among the memory cells MC included in the memory cell array MCA is connected between the bit line BL and the voltage source VSS. Accordingly, in the data read operation, the logic of data stored in the memory cell MC is transmitted to the bit line BL and the sense node SN. In the data write operation, a write current from the second and fifth transistors Tr2 and Tr5 is supplied to the memory cell MC. The voltage source VSS is, for example, a low-level voltage such as a ground voltage.

The reference cell MCref is connected between the reference bit line BLref and the voltage source VSS. A gate of a cell transistor of the reference cell MCref is connected to a reference word line WLref. The reference cell MCref can be common to the memory cells MC in the memory cell array MCA. When the reference word line (second word line) WLref is driven, a resistance element of the reference cell MCref is connected between the reference bit line (second bit line) BLref and the voltage source VSS. Accordingly, the reference cell MCref transmits reference data to the reference bit line BLref and the reference node RN. In this case, a memory element of the reference cell MCref can be a resistance element having an intermediate resistance value between the Set state (a low-resistance state) and the Reset state (a high-resistance state). This enables the reference cell MCref to transmit intermediate data between data "0" and data "1" to the reference bit line BLref and the reference node RN.

When a memory cell MC is in the Reset state (a high-resistance state), the voltage of the sense node SN is kept high. In this case, the voltage of the reference node RN (the voltage of the reference data) is lowered faster than the voltage of the sense node SN (the voltage of information data). Therefore, the sense transistor Tsa2 becomes an on-state earlier than the sense transistor Tsa1 and the sense circuit SA latches a high-level voltage at the node DQ and a low-level voltage at the node BDQ. On the other hand, when a memory cell MC is in the Set state (a low-resistance state), the voltage of the sense node SN (the voltage of the information data) is lowered faster than the voltage of the reference node RN (the voltage of the reference data). Therefore, the sense transistor Tsai becomes an on-state earlier than the sense transistor Tsa2 and the sense circuit SA latches a high-level voltage at the node BDQ and a low-level voltage at the node DQ. In this way, the sense circuit SA can latch the logic of data stored in a memory cell MC by comparing the resistance value of the memory cell MC with the resistance value of the reference cell MCref.

According to the first embodiment, the first operational amplifier AMP1 is shared by the first transistor Tr1 used in the data read operation and the second transistor Tr2 used in the data write operation. The second operational amplifier AMP2 is shared by the third transistor Tr3 used in the data read operation and the fourth transistor Tr4 used in the data write operation. That is, the first and second operational amplifiers AMP1 and AMP2 are both shared by the data read operation and the data write operation. Therefore, the read/write circuit 10 according to the first embodiment does not need to include operational amplifiers that are dedicated for the data read operation and the data write operation, respectively, and thus can reduce the circuit scale.

Furthermore, because the first and second operational amplifiers AMP1 and AMP2 are shared by the data read operation and the data write operation, the sense circuit SA can detect a write state of a memory cell MC in the data write operation. That is, while performing write of data, the read/write circuit 10 according to the first embodiment can perform detection (read) of data in parallel therewith. Accordingly, the read/write circuit 10 can stop the write operation immediately after completion of write of data. This leads to reduction in wasteful current consumption.

An example of operations of the read/write circuit 10 having the above configuration is explained next.
(Data Read Operation)

In a data read operation, the first and second precharge transistors Tprech1 and Tprech2 first become an on-state to precharge the sense node SN and the reference node RN in advance, respectively, and then become an off-state before executing the read operation.

At this time, the reference voltage VREF is already set at a predetermined read voltage (0.5 volt, for example). Accordingly, the first and second operational amplifiers AMP1 and AMP2 control conduction states of the first and third transistors Tr1 and Tr3 to keep the voltage of a bit line BL and the voltage of the reference bit line BLref at a read voltage (VREF), respectively.

The first transistor Tr1 becomes a conduction state according to the output of the first operational amplifier AMP1 under control of the first operational amplifier AMP1. This connects the sense node SN to the bit line BL and the read operation starts by rising the word line WL. After starting the read operation, the voltage of the sense node SN is lowered at a rate corresponding to a resistance state (the Set state or the Reset state) of the relevant memory cell MC. For example, when the memory cell MC is in the Set state (a low-resistance state), the first transistor Tr1 causes charges at the sense node SN to flow to the memory cell MC to keep the voltage of the bit line BL at the predetermined voltage. Because the memory cell MC is in the low-resistance state, the charges are extracted quickly from the sense node SN and the voltage of the sense node SN is lowered rapidly. Therefore, the voltage of the sense node SN becomes a low voltage relatively early. On the other hand, when the memory cell MC is in the Reset state (a high-resistance state), a small amount of charge is sufficient to keep the voltage of the bit line BL at the predetermined voltage. Therefore, the amount of charge extracted from the sense node SN is not so high, and voltage drop of the sense node SN takes a relatively long time. As described above, the voltage of the sense node SN lowers at a rate corresponding to the resistance state of the memory cell MC.

Meanwhile, the third transistor Tr3 becomes a conduction state according to the output of the second operational amplifier AMP2 under control of the second operational amplifier AMP2. This connects the reference node RN to the reference bit line BLref and the voltage of the reference node RN lowers at a rate corresponding to a resistance state (an intermediate state between the Set state and the Reset state) of the reference cell MCref.

The sense circuit SA latches the logic of data of the memory cell MC by comparing the voltage of the sense node SN with the voltage of the reference node RN. For example, when the memory cell MC is in the Set state and the voltage of the sense node SN lowers faster than the voltage of the reference node RN, the sense transistor Tsa1 becomes an on-state earlier than the sense transistor Tsa2, the node BDQ latches a logic high, and the node DQ latches a logic low. On the other hand, when the memory cell MC is in the Reset state and the voltage of the reference node RN lowers faster than the voltage of the sense node SN, the sense transistor Tsa2 becomes an on-state earlier than the sense transistor Tsa1, the node DQ latches a logic high, and the node BDQ latches a logic low. In this way, the sense circuit SA can autonomously (automatically) detect the logic of data of the memory cell MC and latch the logic.

The data latched at the nodes DQ and BDQ can be output outside of the memory 100. Alternatively, in some cases, the data latched at the nodes DQ and BDQ is used to determine a timing to stop the data write operation as explained later.

The sense node SN is disconnected from the bit line BL by the first transistor Tr1. The capacity of the sense node SN is generally smaller than that of the bit line BL and thus the voltage of the sense node SN changes depending on the resistance state of the memory cell MC more greatly than the voltage of the bit line BL does. Accordingly, a signal difference (a voltage difference between the data "0" and the data "1") in the data read operation can be enlarged. Because of an enlarged signal difference, the sense circuit SA can detect the resistance state of the memory cell MC (the data stored in the memory cell MC) accurately and easily.

(Data Write Operation)

In a data write operation, the fifth and sixth transistors Tr5 and Tr6 first become an on-state. At this time, the reference voltage VREF is already set at a predetermined write voltage. The write voltage differs according to data (a resistance state) to be written to a memory cell MC. The write voltage of the Reset state (a high-resistance state) is higher than that of the Set state (a low-resistance state). For example, when the Reset state (a high-resistance state) is to be written to a memory cell MC, the reference voltage VREF is set at Vreset (1.5 volts, for example). When the Set state (a low-resistance state) is to be written to a memory cell MC, the reference voltage VREF is set at Vset (1.2 volts, for example).

This causes the first and second operational amplifiers AMP1 and AMP2 to control the conduction states of the second and fourth transistors Tr2 and Tr4 to keep the voltage of the relevant bit line BL and the voltage of the reference bit line BLref at the write voltage (VREF) corresponding to data to be written, respectively.

The second transistor Tr2 connects the power supply VAA to the bit line BL and causes a current from the power supply VAA to flow to the memory cell MC. Accordingly, data is written to the memory cell MC. The fourth transistor Tr4 connects the power supply VAA to the reference bit line BLref and causes the current from the power supply VAA to flow to the reference cell MCref.

In this case, the first operational amplifier AMP1 is connected in common to the gates of the first and second transistors Tr1 and Tr2 and the second operational amplifier AMP2 is connected in common to the gates of the third and fourth transistors Tr3 and Tr4. In addition, the reference voltage VREF of the data write operation is higher than the reference voltage VREF of the data read operation. Therefore, in the data write operation, the second transistor Tr2 connects the power supply VAA to the bit line BL and the first transistor Tr1 connects the sense node SN to the bit line BL. The fourth transistor Tr4 connects the power supply VAA to the reference bit line BLref and the third transistor Tr3 connects the reference node RN to the reference bit line BLref.

Therefore, when the precharge transistors Tprech1 and Tprech2 perform precharge similarly in the data read operation as mentioned above, the sense circuit SA can detect (monitor) the resistance state of the memory cell MC in parallel with writing to the memory cell MC. Accordingly, the read/write circuit 10 can stop the write current when write of data is completed. For example, when the phase of the memory element is transitioned due to the write current and the resistance state of the memory cell MC changes, the logics of the nodes DQ and BDQ of the sense circuit SA are inverted. Based on inverting of the logics of the nodes DQ and BDQ of the sense circuit SA, the fifth and sixth transistors Tr5 and Tr6 can be brought to a non-conduction state. In this way, the write current can be stopped upon completion of write and wasteful current consumption can be eliminated. Therewith, excessive write operations can be suppressed and the degradation of the reliability can be restricted.

As described above, according to the first embodiment, the first operational amplifier AMP1 is shared by the first transistor Tr1 and the second transistor Tr2 and the second operational amplifier AMP2 is shared by the third transistor Tr3 and the fourth transistor Tr4. Therefore, the first embodiment can reduce the circuit scale of the read/write circuit 10.

Furthermore, in the first embodiment, while performing write of data, the read/write circuit 10 can perform detection (read) of data in parallel therewith. Accordingly, the read/write circuit 10 can autonomously (automatically) stop the write operation immediately after the write of data is completed and can reduce wasteful current consumption. Therewith, excessive write operations can be suppressed and the reliability can be enhanced.

(Modification)

In the first embodiment, when data is to be detected, the first and second precharge transistors Tprech1 and Tprech2 become an off-state after precharging the sense node SN and the reference node RN, respectively.

However, the first and second precharge transistors Tprech1 and Tprech2 can be an on-state when data is to be detected. In this case, the first and second precharge transistors Tprech1 and Tprech2 keep supplying the current from the power supply VAA to the sense node SN and the reference node RN, respectively, during detection of data.

Operations of the first to sixth transistors Tr1 to Tr6 can be identical to those in the data read operation or the data write operation according to the first embodiment.

Even when the first and second precharge transistors Tprech1 and Tprech2 keep supplying the current during data detection, a difference occurs between the voltage of the sense node SN and the voltage of the reference node RN due to a difference between the cell current flowing in the memory cell MC and the reference current flowing in the reference cell MCref similarly to the first embodiment. As a result, the sense circuit SA can latch a logic corresponding to the resistance state of the memory cell MC.

A configuration of the read/write circuit 10 according to the present modification can be identical to that in the first embodiment. Therefore, the present modification can reduce the circuit scale of the read/write circuit 10 as the first embodiment.

In the present modification, because the current from the power supply VAA is continuously supplied to the sense node SN and the reference node RN during detection of data, current consumption is larger than that in the first embodiment. However, also in the present modification, while performing write of data, the read/write circuit 10 can perform detection (read) of data in parallel therewith as in the first embodiment. Accordingly, the read/write circuit 10 can stop the write operation immediately after completion of write of data and can reduce wasteful current consumption. Furthermore, according to the present modification, because the write operation is stopped immediately after completion of data write, excessive write operations can be suppressed and the reliability can be enhanced.

(Second Embodiment)

Figure 5:
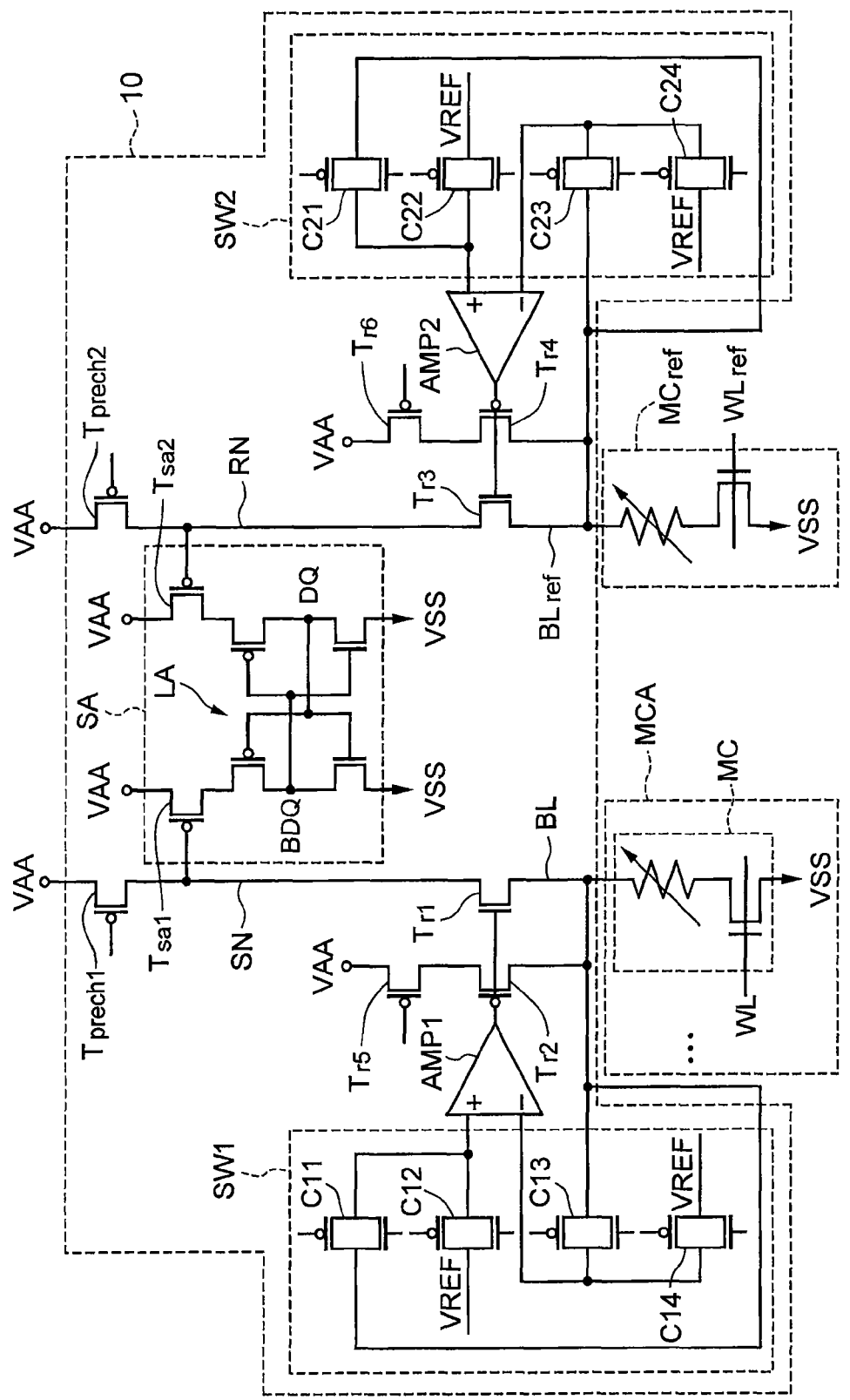
FIG. 5 is a circuit diagram showing an example of configurations of the read/write circuit 10, the memory cells MC, and the reference cell MCref of the memory 100 according to a second embodiment.

FIG. 5 is a circuit diagram showing an example of configurations of the read/write circuit 10, the memory cells MC, and the reference cell MCref of the memory 100 according to a second embodiment. The second embodiment is different from the first embodiment in that the second and fourth transistors Tr2 and Tr4 are P-type transistors.

Because the conductivity type of a channel of the second transistor Tr2 is different from that of the first transistor Tr1, connection between the operational amplifier AMP1 and the bit lines BL and connection between the first operational amplifier AMP1 and the reference voltage VREF need to be interchanged between the data read operation and the data write operation. Because the conductivity type of a channel of the fourth transistor Tr4 is different from that of the third transistor Tr3, connection between the operational amplifier AMP2 and the reference bit line BLref and connection between the second operational amplifier AMP2 and the reference voltage VREF need to be interchanged between the data read operation and the data write operation. For this purpose, the read/write circuit 10 according to the second embodiment further includes a first switching circuit SW1 connected between the bit lines BL, the reference voltage VREF and the first operational amplifier AMP1, and a second switching circuit SW2 connected between the reference bit line BLref, the reference voltage VREF and the second operational amplifier AMP2.

The first switching circuit SW1 includes switches C11 to C14 each configured by connecting a P-type transistor and an N-type transistor in parallel. The switch C11 is connected between the non-inverting input of the first operational amplifier AMP1 and the bit lines BL. The switch C12 is connected between the non-inverting input of the first operational amplifier AMP1 and the reference voltage VREF. The switch C13 is connected between the inverting input of the first operational amplifier AMP1 and the bit lines BL. The switch C14 is connected between the inverting input of the first operational amplifier AMP1 and the reference voltage VREF.

The second switching circuit SW2 includes switches C21 to C24. The switch C21 is connected between the non-inverting input of the second operational amplifier AMP2 and the reference bit line BLref. The switch C22 is connected between the non-inverting input of the second operational amplifier AMP2 and the reference voltage VREF. The switch C23 is connected between the inverting input of the second operational amplifier AMP2 and the reference bit line BLref. The switch C24 is connected between the inverting input of the second operational amplifier AMP2 and the reference voltage VREF.

Other configurations of the second embodiment can be identical to corresponding configurations of the first embodiment. Accordingly, the second embodiment can achieve identical effects as those of the first embodiment.

In the first embodiment, the second and fourth transistors Tr2 and Tr4 are N-type transistors. In this case, when the write voltage Vreset (1.5 volts, for example) of the Reset state is to be applied to a bit line BL, the first operational amplifier AMP1 needs to apply a voltage of (Vreset (1.5 volts, for example)+Vthtr2) to the gate of the second transistor Tr2 and the second operational amplifier AMP2 needs to apply a voltage of (Vreset (1.5 volts, for example)+ Vthtr4) to the gate of the fourth transistor Tr4. That is, the first and second operational amplifiers AMP1 and AMP2 need to output voltages higher than Vreset (1.5 volts, for example), which is disadvantageous for lowering of the power supply voltage. In this example, Vthtr2 is a threshold voltage of the second transistor Tr2 and Vthtr4 is a threshold voltage of the fourth transistor Tr4.

In contrast thereto, the second and fourth transistors Tr2 and Tr4 are P-type transistors in the second embodiment. Therefore, the second transistor Tr2 becomes an on-state with a lower voltage than VAA-Vthtr2 and the fourth transistor Tr4 becomes an on-state with a lower voltage than VAA-Vthtr4. Accordingly, the gate voltages of the second and fourth transistors Tr2 and Tr4 can be set to be lower in the absolute values and the power supply voltages of the first and second operational amplifiers AMP1 and AMP2 can be lowered.

When the second and fourth transistors Tr2 and Tr4 are N-type transistors, source voltages of the second and fourth transistors Tr2 and Tr4 are the voltage of the bit line BL and the voltage of the reference bit line BLref, respectively. Therefore, the second transistor Tr2 does not become a conduction state unless a voltage equal to or higher than the sum of the voltage of the bit line BL and the threshold voltage of the second transistor Tr2 is applied to the gate of the second transistor Tr2. The fourth transistor Tr4 does not become a conduction state unless a voltage equal to or higher than the sum of the voltage of the reference bit line BLref and the threshold voltage of the fourth transistor Tr4 is applied to the gate of the fourth transistor Tr4. When the voltage of the bit line BL or the voltage of the reference bit line BLref is high, there is a risk that the second or fourth transistor Tr2 or Tr4 does not become a conduction state unless a voltage higher than the power supply voltage VAA is applied to the gate thereof. This hinders lowering of the power supply voltage VAA. In contrast thereto, in the second embodiment, the P-type transistors are used as the second and fourth transistors Tr2 and Tr4, thereby enabling lowering of the power supply voltage as mentioned above.

(Data Read Operation)

In a data read operation, the switches C12, C13, C22, and C23 become an on-state and the switches C11, C14, C21, and C24 become an off-state. Accordingly, the reference voltage VREF is input to the non-inverting input of the first operational amplifier AMP1 and the bit lines BL are connected to the inverting input thereof. The reference voltage VREF is input to the non-inverting input of the second operational amplifier AMP2 and the reference bit line BLref is connected to the inverting input thereof. This configuration of the read/write circuit 10 is identical to that of the read/write circuit 10 according to the first embodiment in the data read operation. Accordingly, the sense circuit SA can detect data (a resistance state) of a memory cell MC and latch the detected data.

The sense circuit shown in FIG. 16 may be used instead of that shown in FIG. 5 as well as the first embodiment. Therefore, it is possible to reduce the layout area of the sense circuit, since operation amplifier in the sense circuit is used in the both of the verify reading and the writing of data.

(Data Write Operation)

In a data write operation, the switches C11, C14, C21, and C24 become an on-state and the switches C12, C13, C22, and C23 become an off-state. Accordingly, the reference voltage VREF is input to the inverting input of the first operational amplifier AMP1 and the bit lines BL are connected to the non-inverting input thereof. That is, connection relations of input terminals of the first operational amplifier AMP1 are interchanged between the reference voltage VREF and the bit lines BL. The reference voltage VREF is input to the inverting input of the second operational amplifier AMP2 and the reference bit line BLref is connected to the non-inverting input thereof. That is, connection relations of input terminals of the second operational amplifier AMP2 are interchanged between the reference voltage VREF and the reference bit line BLref. This enables the read/write circuit 10 to perform the data write operation even when the second and fourth transistors Tr2 and Tr4 are P-type transistors.

Other operations of the second embodiment can be identical to those of the first embodiment. Accordingly, the second embodiment can achieve identical effects as those of the first embodiment.

According to the second embodiment, the second and fourth transistors Tr2 and Tr4 are P-type transistors. Accordingly, the power supply voltages of the first and second operational amplifiers AMP1 and AMP2 can be lowered as described above.

Furthermore, the first and third transistors Tr1 and Tr3 used for the data read operation are still the N-type transistors. Therefore, the read/write circuit 10 can perform the data read operation at a high speed.

The second embodiment can be combined with the above modification.

(Third Embodiment)

Figure 6:
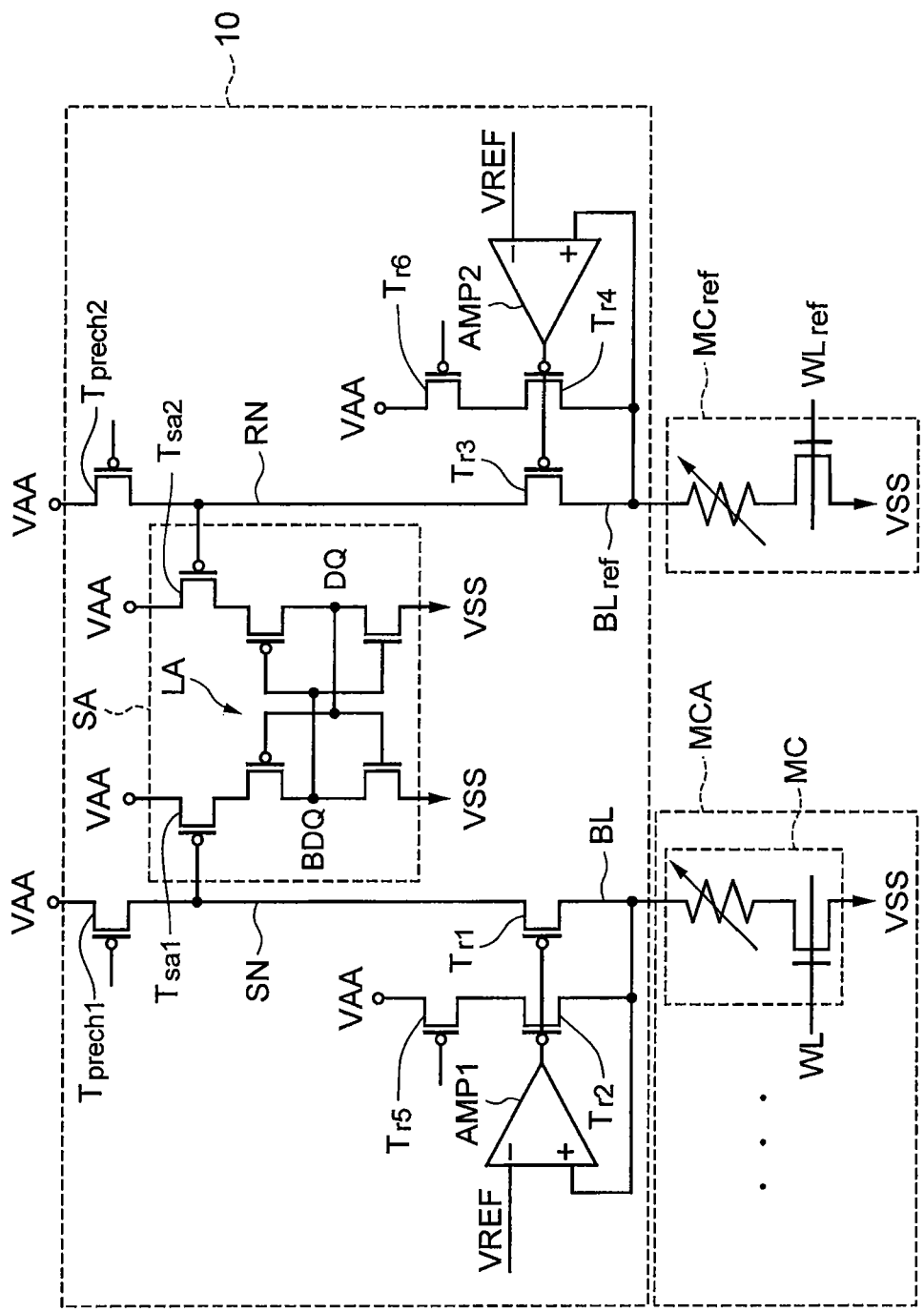
FIG. 6 is a circuit diagram showing an example of configurations of the read/write circuit 10, the memory cells MC, and the reference cell MCref of the memory 100 according to a third embodiment.

FIG. 6 is a circuit diagram showing an example of configurations of the read/write circuit 10, the memory cells MC, and the reference cell MCref of the memory 100 according to a third embodiment.

The sense circuit shown in FIG. 16 may be used instead of that shown in FIG. 6 as well as the first and second embodiments. Therefore, it is possible to reduce the layout area of the sense circuit, since operation amplifier in the sense circuit is used in the both of the verify reading and the writing of data.

The third embodiment is different from the first embodiment in that the first to fourth transistors Tr1 to Tr4 are P-type transistors. In the third embodiment, because the conductivity types of channels of the first to fourth transistors Tr1 to Tr4 are uniformly the P types, the first and second switching circuits SW1 and SW2 in FIG. 5 are not required. However, connection relations of the input terminals of the first and second operational amplifiers AMP1 and AMP2 are opposite to those in the first embodiment. That is, the non-inverting input terminals of the first and second operational amplifiers AMP1 and AMP2 are connected to the bit lines BL and the reference bit line BLref, respectively. The inverting input terminals of the first and second operational amplifiers AMP1 and AMP2 are connected to the reference voltage VREF. Other configurations of the third embodiment can be identical to corresponding configurations of the first embodiment. Accordingly, the third embodiment can achieve identical effects as those of the first embodiment.

The read/write circuit 10 according to the third embodiment has a smaller circuit scale than that of the second embodiment because the first and second switching circuits SW1 and SW2 are not required.

Furthermore, because the second and fourth transistors Tr2 and Tr4 are the P-type transistors, the power supply voltages of the operational amplifiers AMP1 and AMP2 can be lowered. Because the first and third transistors Tr1 and Tr3 are the P-type transistors, the data read rate is lower than that in the second embodiment.

The third embodiment can be combined with the above modification.

(Fourth Embodiment)

Figure 7:
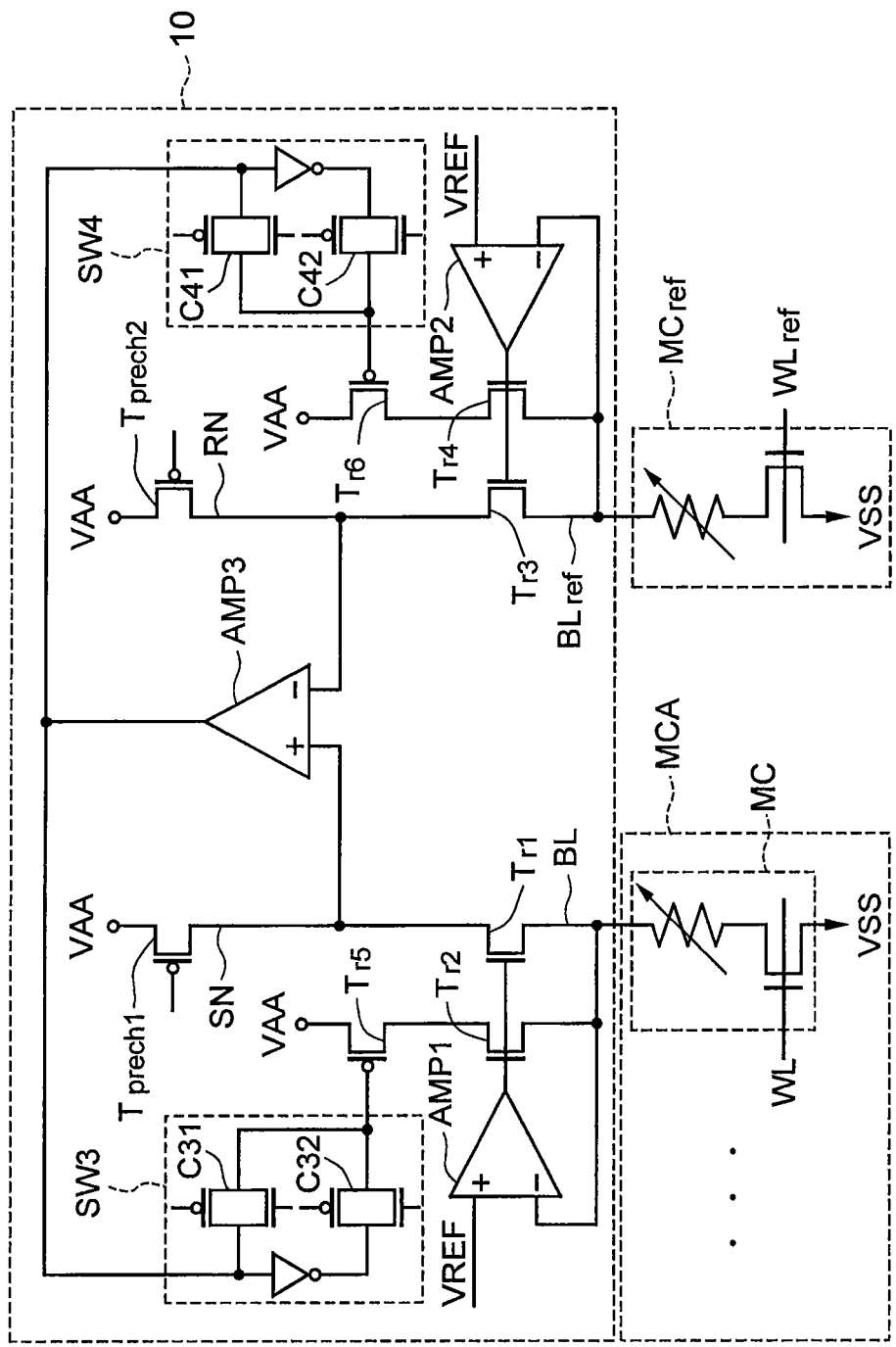
FIG. 7 is a circuit diagram showing an example of configurations of the read/write circuit 10, the memory cells MC, and the reference cell MCref of the memory 100 according to a fourth embodiment.

FIG. 7 is a circuit diagram showing an example of configurations of the read/write circuit 10, the memory cells MC, and the reference cell MCref of the memory 100 according to a fourth embodiment.

In the fourth embodiment, the sense circuit SA and the sense transistors Tsa1 and Tsa2 are replaced by a third operational amplifier AMP3. A non-inverting input of the third operational amplifier AMP3 is connected to the sense node SN and an inverting input thereof is connected to the reference node RN. The third operational amplifier AMP3 compares the voltage of the sense node SN with the voltage of the reference node RN and outputs the logic of data of a memory cell MC.

An output of the third operational amplifier AMP3 is connected to a gate of the fifth transistor Tr5 via a switching circuit (first switching circuit) SW3 and is connected to a gate of the sixth transistor Tr6 via a switching circuit SW4. That is, the switching circuit SW3 is connected between the output of the third operational amplifier AMP3 and the gate of the fifth transistor Tr5 and the switching circuit SW4 is connected between the output of the third operational amplifier AMP3 and the gate of the sixth transistor Tr6. The switching circuit SW3 includes switches C31 and C32 and the switching circuit SW4 includes switches C41 and C42.

The switching circuit SW3 brings the fifth transistor Tr5 to a non-conduction state when the logic of an output signal of the third operational amplifier AMP3 is inverted. The switching circuit SW4 brings the sixth transistor Tr6 to the non-conduction state when the logic of the output signal of the third operational amplifier AMP3 is inverted. For example, when the Reset state (a high-resistance state) is to be written to a memory cell MC in the Set state (a low-resistance state), the sequence controller SC in FIG. 1 brings the switches C31 and C41 to a conduction state and the switches C32 and C42 to a non-conduction state. When the memory cell MC is in the Set state (a low-resistance state), the voltage of the sense node SN is lower than that of the reference node RN and thus the third operational amplifier AMP3 outputs a logic low. Therefore, the fifth transistor Tr5 becomes the conduction state and the write current is supplied to the memory cell MC via the second transistor Tr2. When the Reset state (a high-resistance state) has been written to the memory cell MC, the voltage of the sense node SN becomes higher than that of the reference node RN and thus the third operational amplifier AMP3 outputs a logic high. Therefore, the fifth transistor Tr5 becomes a non-conduction state and supply of the write current is autonomously stopped. On the other hand, when the Set state (a low-resistance state) is to be written to a memory cell MC in the Reset state (a high-resistance state), the switches C32 and C42 are brought to the conduction state and the switches C31 and C41 are brought to the non-conduction state. When the memory cell MC is in the Reset state (a high-resistance state), the voltage of the sense node SN is higher than that of the reference node RN and thus the third operational amplifier AMP3 outputs a logic high. The fifth transistor Tr5 receives an inverted signal of the output of the third operational amplifier AMP3 via the switch C32. Therefore, the fifth transistor Tr5 becomes the conduction state and the write current is supplied to the memory cell MC via the second transistor Tr2. When the Set state (a low-resistance state) has been written to the memory cell MC, the voltage of the sense node SN becomes lower than that of the reference node RN and thus the third operational amplifier AMP3 outputs a logic low.

The fifth transistor Tr5 receives an inverted signal of the output of the third operational amplifier AMP3 via the switch C32. Therefore, the fifth transistor Tr5 becomes the non-conduction state and supply of the write current is autonomously stopped.

As described above, also when the sense circuit SA and the like are replaced by the operational amplifier AMP3, the read/write circuit 10 can autonomously stop the write operation immediately after completion of write of data. Accordingly, wasteful current consumption can be reduced and excessive write operations can be suppressed to enhance the reliability.

Other configurations and operations of the fourth embodiment can be identical to corresponding configurations and operations of the first embodiment. Accordingly, the fourth embodiment can achieve identical effects as those of the first embodiment.

The fourth embodiment can be combined with the above modification.

(Fifth Embodiment)

Figure 8:
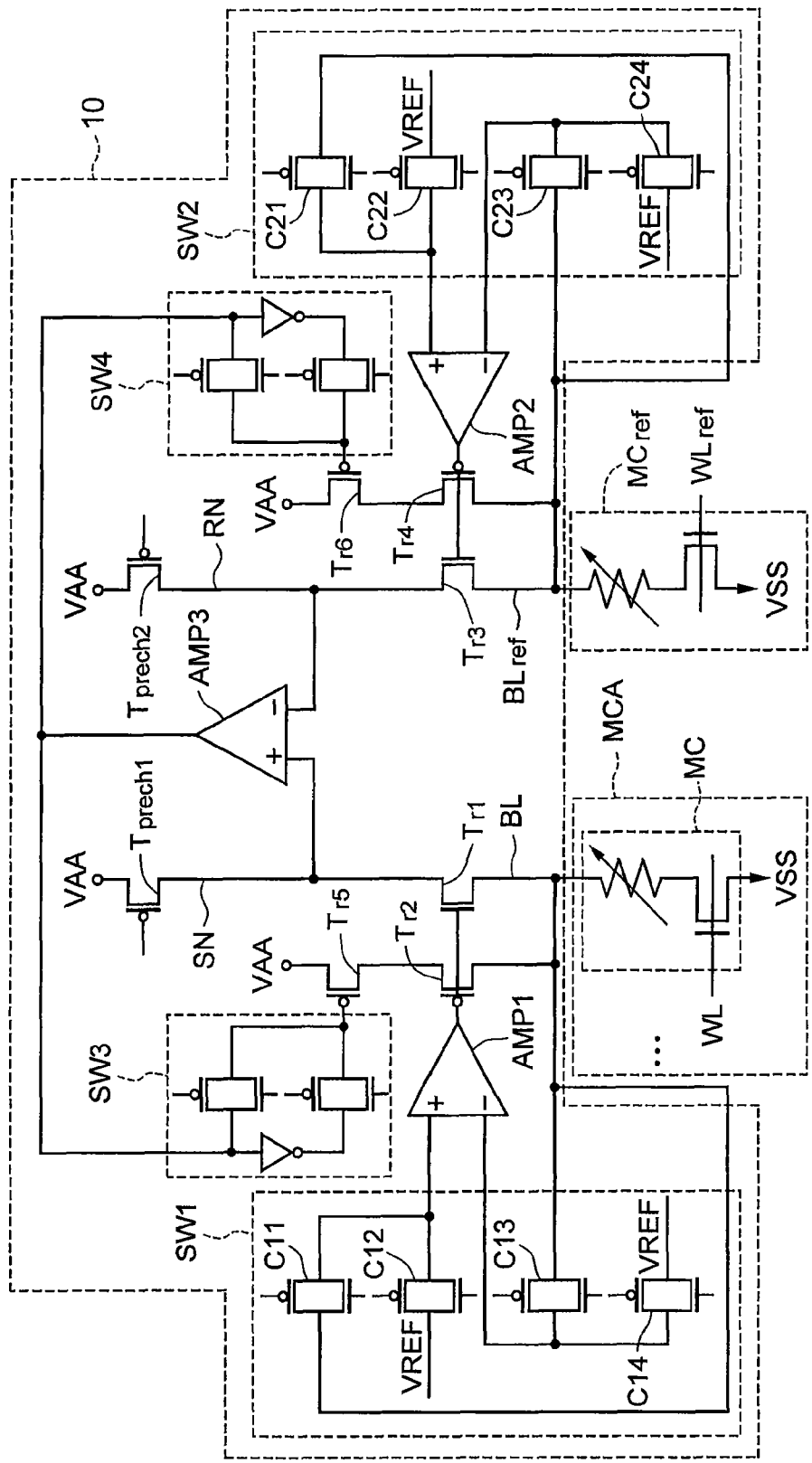
FIG. 8 is a circuit diagram showing an example of configurations of the read/write circuit 10, the memory cells MC, and the reference cell MCref of the memory 100 according to a fifth embodiment.

FIG. 8 is a circuit diagram showing an example of configurations of the read/write circuit 10, the memory cells MC, and the reference cell MCref of the memory 100 according to a fifth embodiment.

The fifth embodiment is a combination of the second embodiment and the fourth embodiment. Therefore, the sense circuit SA and the sense transistors Tsa1 and Tsa2 in FIG. 5 are replaced by the third operational amplifier AMP3. The non-inverting input of the third operational amplifier AMP3 is connected to the sense node SN and the inverting input thereof is connected to the reference node RN. The third operational amplifier AMP3 compares the voltage of the sense node SN with the voltage of the reference node RN and outputs the logic of data in a memory cell MC. Other configurations of the fifth embodiment can be identical to corresponding configurations of the second embodiment. Accordingly, the fifth embodiment can achieve identical effects as those of the second and fourth embodiments.

The fifth embodiment can be combined with the above modification.

(Sixth Embodiment)

Figure 9:
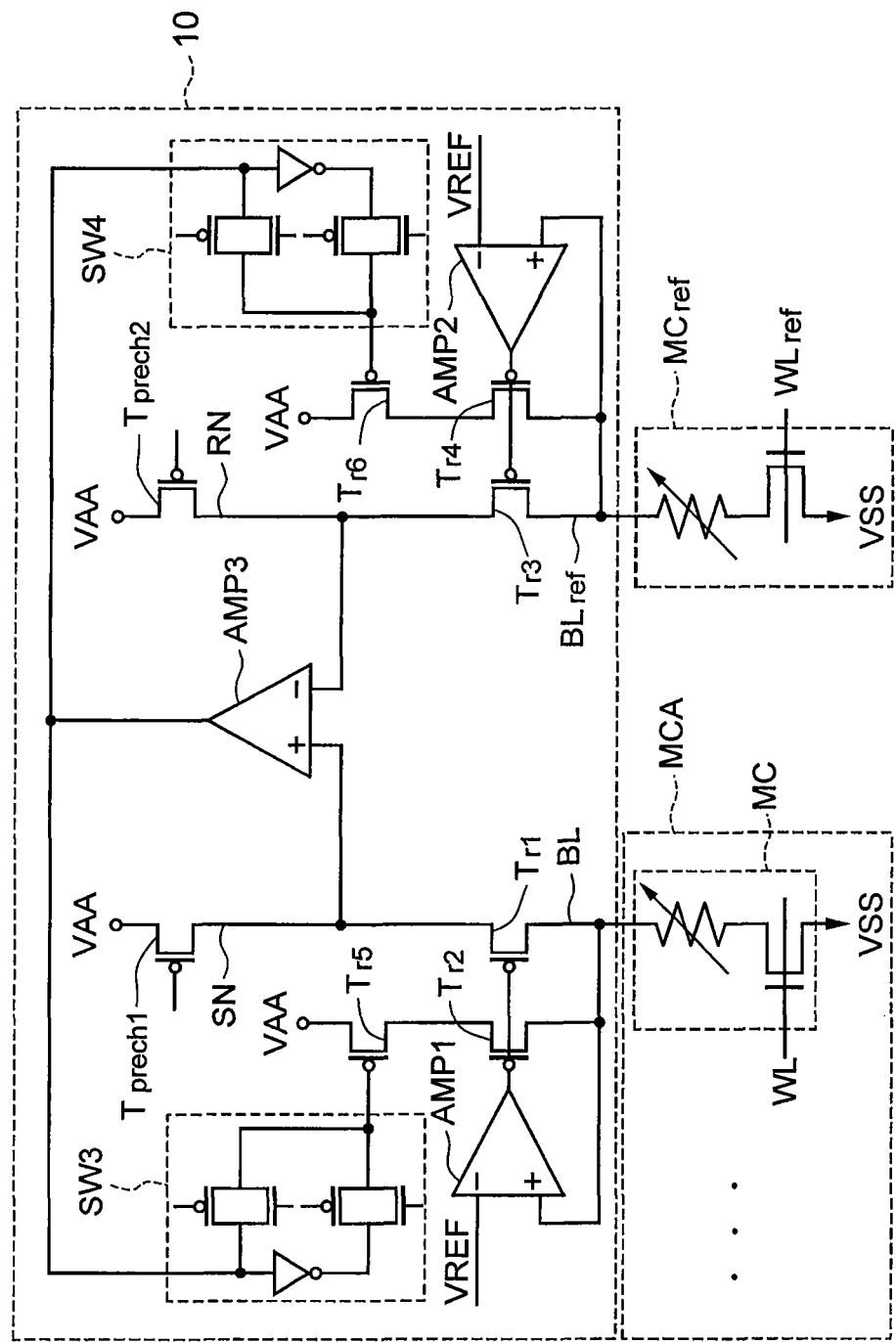
FIG. 9 is circuit diagram showing an example of configurations of the read/write circuit 10, the memory cells MC, and the reference cell MCref of the memory 100 according to a sixth embodiment.

FIG. 9 is circuit diagram showing an example of configurations of the read/write circuit 10, the memory cells MC, and the reference cell MCref of the memory 100 according to a sixth embodiment.

The sixth embodiment is a combination of the third embodiment and the fourth embodiment. Therefore, the sense circuit SA and the sense transistors Tsa1 and Tsa2 in FIG. 6 are replaced by the third operational amplifier AMP3. The non-inverting input of the third operational amplifier AMP3 is connected to the sense node SN and the inverting input thereof is connected to the reference node RN. The third operational amplifier AMP3 compares the voltage of the sense node SN with the voltage of the reference node RN and outputs the logic of data in a memory cell MC. Other configurations of the sixth embodiment can be identical to corresponding configurations of the third embodiment. Accordingly, the sixth embodiment can achieve identical effects as those of the third and fourth embodiments.

The sixth embodiment can be combined with the above modification.

(Seventh Embodiment)

Figure 10:
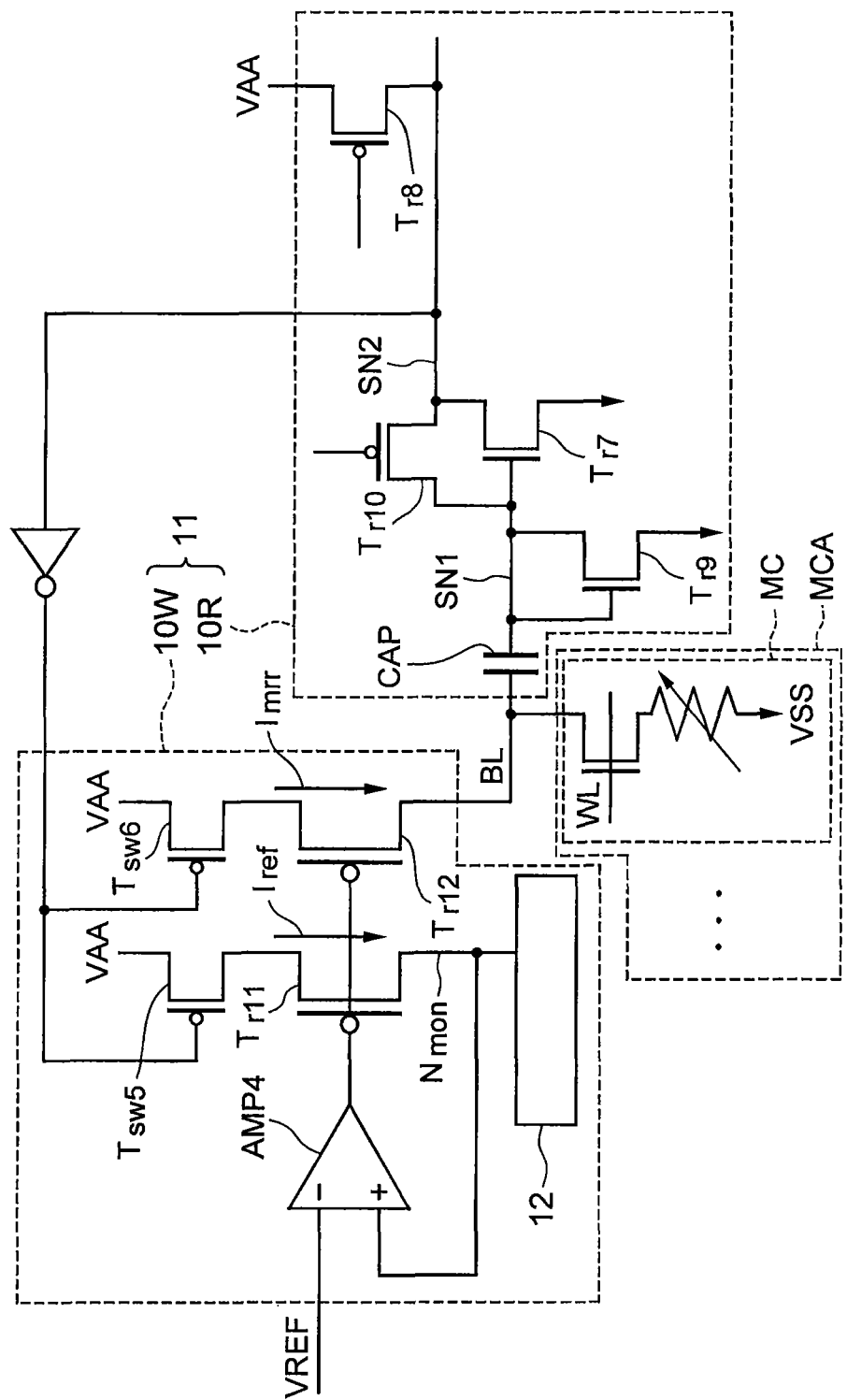
FIG. 10 is a circuit diagram showing an example of configurations of a write circuit 11 and the memory cells MC of the memory 100 according to a seventh embodiment.

FIG. 10 is a circuit diagram showing an example of configurations of a write circuit 11 and the memory cells MC of the memory 100 according to a seventh embodiment. A read circuit is provided separately from the write circuit 11 and is not shown in FIG. 10. Configurations of the memory cells MC and the memory cell array MCA can be identical to those in the first embodiment.

The write circuit 11 according to the seventh embodiment includes a write part 10W and a write detector 10R. The write part 10W is configured to stop a write current based on a data detection result of the write detector 10R.

The write detector 10R includes seventh to tenth transistors Tr7 to Tr10 and a capacitor CAP. The seventh transistor Tr7 is an N-type transistor and is connected between a sense node (second node) SN2 and a low-level voltage source VSS (not shown). A gate of the seventh transistor Tr7 is connected to the bit lines BL via the capacitor CAP. The eighth transistor Tr8 is a P-type transistor and is connected between the seventh transistor Tr7 and the power supply voltage VAA. A gate and a drain of the ninth transistor Tr9 are connected in common to a sense node (first node) SN1 between the seventh transistor Tr7 and the capacitor CAP. A source of the ninth transistor Tr9 is connected to the voltage source VSS. The ninth transistor Tr9 is an N-type transistor. The tenth transistor Tr10 is a P-type transistor and is connected between the sense node SN1 and the sense node SN2.

A size (W/L) of the ninth transistor Tr9 can be the same as that of the seventh transistor Tr7 or, more preferably, shorter than that of the seventh transistor Tr7 in order to have a short channel effect. The threshold voltage of the ninth transistor Tr9 is equal to or lower than that of the seventh transistor Tr7. Preferably, the threshold voltage of the ninth transistor Tr9 is equal to or slightly lower than that of the seventh transistor Tr7. This enables the seventh transistor Tr7 to be a state close to a conduction state (a state immediately before the conduction state) during precharge as described later.

The write part 10W includes an eleventh transistor Tr11, a twelfth transistor 12, switching transistors Tsw5 and Tsw6, a fourth operational amplifier AMP4, and a current generation circuit 12.

The switching transistor Tsw5 and the eleventh transistor Tr11 are connected in series between the power supply VAA and the current generation circuit 12. The switching transistor Tsw6 and the twelfth transistor 12 are connected in series between the power supply VAA and the bit lines BL.

A non-inverting input of the fourth operational amplifier AMP4 is connected to a node Nmon between the eleventh transistor Tr11 and the current generation circuit 12. An inverting input of the fourth operational amplifier AMP4 is connected to the reference voltage VREF. An output of the fourth operational amplifier AMP4 is connected in common to gates of the eleventh and twelfth transistors Tr11 and Tr12.

Accordingly, the fourth operational amplifier AMP4 controls the conduction state of the eleventh transistor Tr11 to keep the voltage of the node Nmon at the reference voltage VREF. The current generation circuit 12 determines a reference current Iref flowing in the switching transistor Tsw5 and the eleventh transistor Tr11. The switching transistor Tsw6 and the twelfth transistor Tr12 cause a mirror current Imrr corresponding to the reference current Iref to flow. The mirror current Imrr is a current flowing in a memory cell MC in the data read operation or the data write operation.

The second node SN2 is connected to gates of the switching transistors Tsw5 and Tsw6 via an inverter. Accordingly, for example, when the Reset state (a high-resistance state) is written to a memory cell MC in the Set state (a low-resistance state), the write circuit 11 brings the switching transistors Tsw5 and Tsw6 to an off-state based on a change in the voltage of the second node SN2. As a result, the write circuit 11 can stop supply of the reference current Iref and the mirror current Imrr and can end the write operation autonomously.

A Reset write operation of the write circuit 11 according to the seventh embodiment is explained next.

First, when the eighth and tenth transistors Tr8 and Tr10 become an on-state during precharge, the second node SN2 is charged at the power supply voltage VAA. The first node SN1 is charged via the tenth transistor Tr10. At that time, assuming that the threshold voltage of the ninth transistor Tr9 is Vthtr9, the voltage of the first node SN1 is charged at VSS+Vthtr9. As described above, it is preferable that the threshold voltage of the ninth transistor Tr9 be equal to or slightly lower than that of the seventh transistor Tr7. Therefore, in this precharge, the first node SN1 is charged at a voltage equal to or slightly lower than the threshold voltage of the seventh transistor Tr7. That is, the seventh transistor Tr7 becomes a state close to a conduction state (a state immediately before the conduction state).

Next, the eighth and tenth transistors Tr8 and Tr10 are brought to an off-state and then the write part 10W causes the mirror current Imrr as well as the reference current Iref to flow. When a memory cell MC changes from the Set state to the Reset state due to the mirror current Imrr, the voltage of the first node SN1 rises and the seventh transistor Tr7 becomes a conduction state. Short-pulse noises included in the voltage of the first node SN1 are removed to the voltage source VSS due to a filter circuit constituted by the ninth transistor Tr9. Due to the filter circuit, switching-off of the switching transistors Tsw5 and Tsw6 occurs surely, since the switching transistors Tsw5 and Tsw6 are hardly affected by the noises by the filter circuit. As a result, the write circuit 11 can stop the write current autonomously without being affected by the noises. In this case, the ninth transistor Tr9 serves both a function to determine a precharge voltage of the first node SN1 and a function as an element of the filter circuit.

As described above, the write circuit 11 according to the seventh embodiment can stop the write current autonomously after completion of write of the Reset state. Accordingly, wasteful current consumption can be reduced and also excessive write can be prevented to prevent degradation of the reliability.

The write circuit 11 is a circuit that writes the Reset state. In a circuit that writes the Set state (FIG. 16), the seventh transistor Tr7 of the write circuit 11 is changed to a P-type transistor and the source of the seventh transistor Tr7 is connected to a high-level voltage source VAA. The eighth transistor Tr8 is changed to an N-type transistor and the source of the eighth transistor Tr8 is connected to a low-level voltage source VSS. The ninth transistor Tr9 is changed to a P-type transistor and the source of the ninth transistor Tr9 is connected to the high-level voltage source VAA. A non-inverting logic of the second node SN2 is input to the gates of the switching transistors Tsw5 and Tsw6. That is, the inverter between the second node SN2 and the switching transistors Tsw5 and Tsw6 in FIG. 10 is not provided. Alternately, even number of the inverters may be provided therebetween in order to transmit the data of the second node SN2 in non-inverted state. The circuit that writes the Set state is configured in this way.

In this case, at the time of precharge, the voltage of the first node SN1 is precharged at a voltage equal to or slightly higher than the threshold voltage of the seventh transistor Tr7.

When a memory cell MC changes from the Reset state to the Set state, the voltage of the first node SN1 lowers and the seventh transistor Tr7 becomes a conduction state. Because the seventh transistor Tr7 is connected to the power supply VAA, the voltage of the second node SN2 rises correspondingly and the switching transistors Tsw5 and Tsw6 become an off-state. Due to the filter circuit, switching-off of the switching transistors Tsw5 and Tsw6 occurs surely without affected by the noises, substantially.

As described above, the Set write circuit according to the seventh embodiment can stop the write current autonomously after completion of write of the Set state. This enables reduction of wasteful current consumption, suppression of excessive write operations, and enhancement of the reliability.

Figure 17:
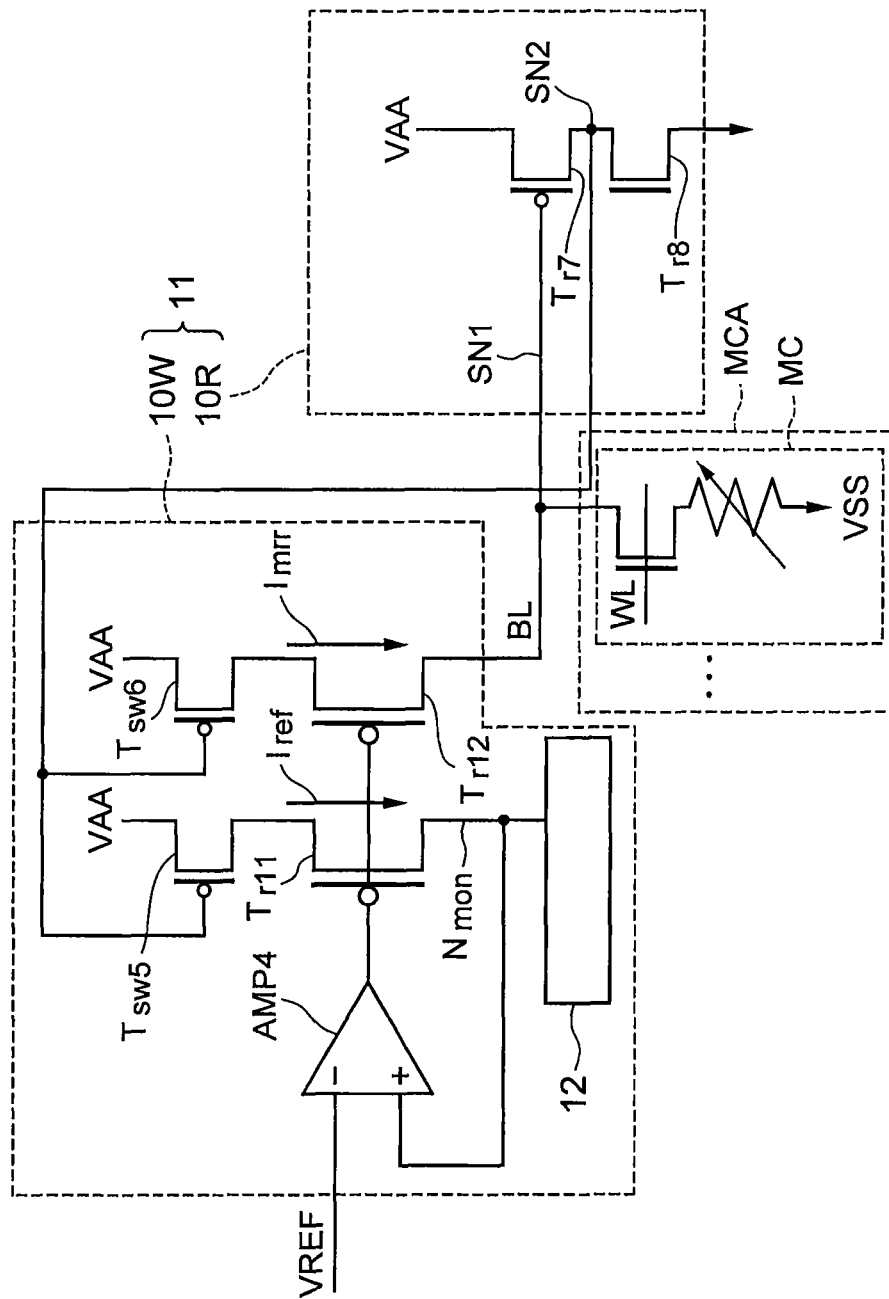
FIG. 17 is a circuit diagram showing an example of configurations of a write circuit that writes the Set state according to a eighth embodiment.

The write detector 10R for the Reset state and the write detector for the Set state (FIG. 17) have been explained individually. However, these write detectors can be connected in parallel to one write part (10W). That is, the write detectors for the Reset state and the Set state can be provided for a common write part (10W).

(Eighth Embodiment)

Figure 11:
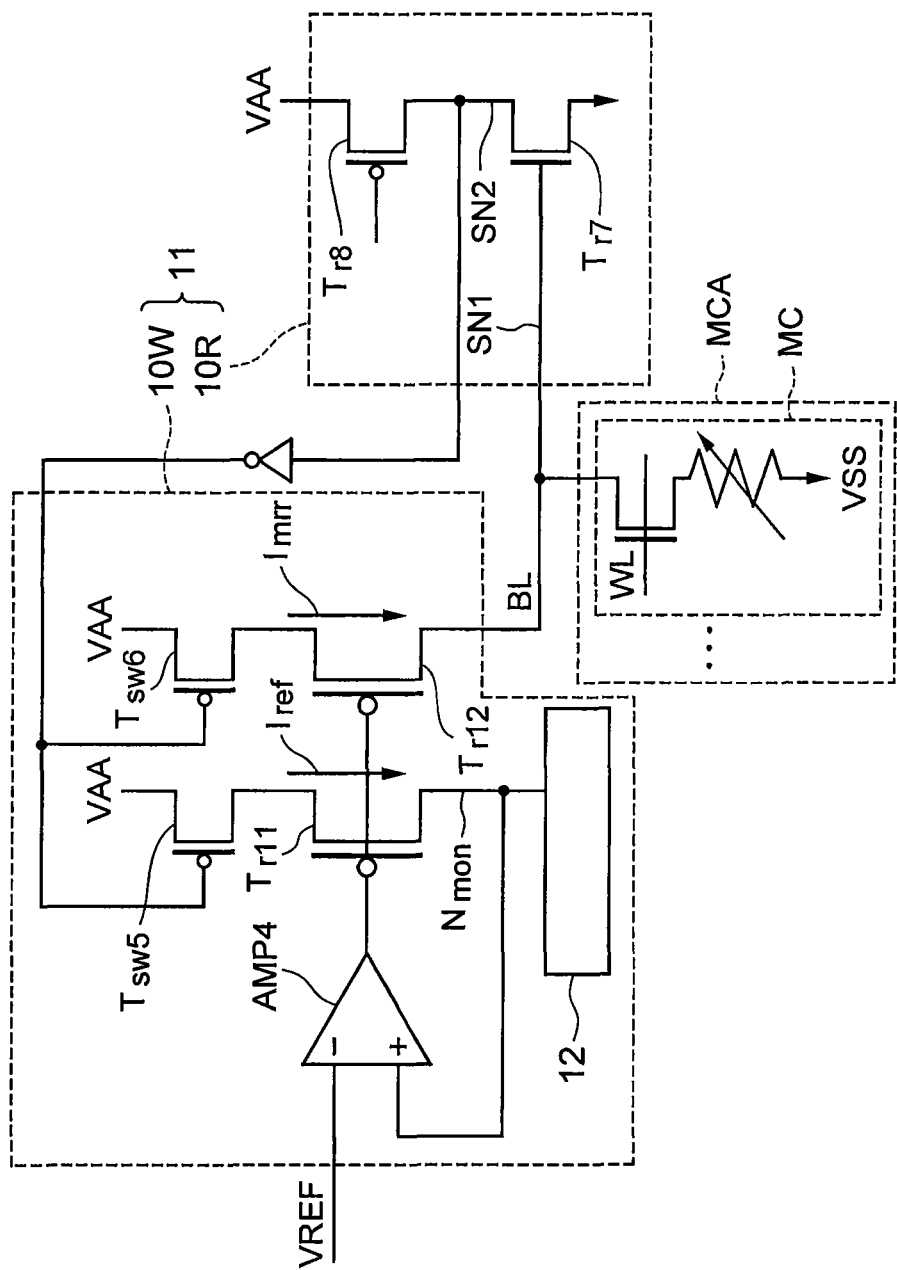
FIG. 11 is a circuit diagram showing an example of configurations of the write circuit 11 and the memory cells MC of the memory 100 according to an eighth embodiment.

FIG. 11 is a circuit diagram showing an example of configurations of the write circuit 11 and the memory cells MC of the memory 100 according to an eighth embodiment. A read circuit is provided separately from the write circuit 11 and is not shown in FIG. 11. The configurations of the memory cell MC and the memory cell array MCA can be identical to those in the first embodiment.

The write circuit 11 according to the eighth embodiment is different from that according to the seventh embodiment in that the capacitor CAP, the ninth transistor Tr9, and the tenth transistor Tr10 are omitted. Because the capacitor CAP is not provided, the first node SN1 is connected directly to the bit lines BL. Other configurations of the eighth embodiment can be identical to corresponding configurations of the seventh embodiment.

A Reset write operation of the write circuit 11 according to the eighth embodiment is explained next.

First, at the time of precharge, when the eighth transistor Tr8 becomes an on-state, the second node SN2 is charged at the power supply voltage VAA.

Next, the eighth transistor Tr8 is brought to an off-state and then the write part 10W causes the mirror current Imrr as well as the reference current Iref to flow. When a memory cell MC changes from the Set state to the Reset state due to the mirror current Imrr, the voltages of the relevant bit line BL and the first node SN1 rise and the seventh transistor Tr7 becomes a conduction state. The seventh transistor Tr7 becomes the conduction state immediately after phase transition from the Set state to the Reset state in the memory cell MC. When the seventh transistor Tr7 becomes the conduction state, the voltage of the second node SN2 lowers and the switching transistors Tsw5 and Tsw6 become an off-state. As a result, the write circuit 11 can stop the write current autonomously after write of the Reset state is completed.

In this way, the write circuit 11 according to the eighth embodiment can stop the write current autonomously after completion of write of the Reset state. Accordingly, wasteful current consumption can be reduced and also excessive write operations can be suppressed to prevent degradation of the reliability.

In a circuit that writes the Set state (not shown), the seventh transistor Tr7 of the write circuit 11 is changed to a P-type transistor and the source of the seventh transistor Tr7 is connected to a high-level voltage source VAA. It also suffices that the eighth transistor Tr8 is changed to an N-type transistor and that the source thereof is connected to a voltage source VSS. In this case, when a memory cell MC changes from the Reset state to the Set state, the voltages of the relevant bit line BL and the first node SN1 lower and the seventh transistor Tr7 becomes a conduction state. Because the seventh transistor Tr7 is connected to the power supply VAA, the voltage of the second node SN2 rises. Furthermore, the inverter between the second node SN2 and the switching transistors Tsw5 and Tsw6 in FIG. 11 is not provided. Alternately, even number of the inverters may be provided therebetween in order to transmit the data of the second node SN2 in non-inverted state. Accordingly, the switching transistors Tsw5 and Tsw6 become an off-state. As a result, the Set write circuit can autonomously stop the write current immediately after write of the Set state is completed.

In this way, the Set write circuit according to the eighth embodiment can stop the write current autonomously after completion of write of the Set state. Because the write operation is stopped immediately after write of data is completed, excessive write operations can be suppressed and the reliability can be enhanced.

Furthermore, because the capacitor CAP and the transistors Tr9 and Tr10 are not provided in the eighth embodiment, the layout area can be reduced as compared to the seventh embodiment.

In the first to eighth embodiments, a plurality of paths for supplying the write current (current paths including the transistors Tr2 and Tr5 and current paths including the transistors Tr12 and Tsw6) can be provided.

(Ninth Embodiment)

Figure 12:
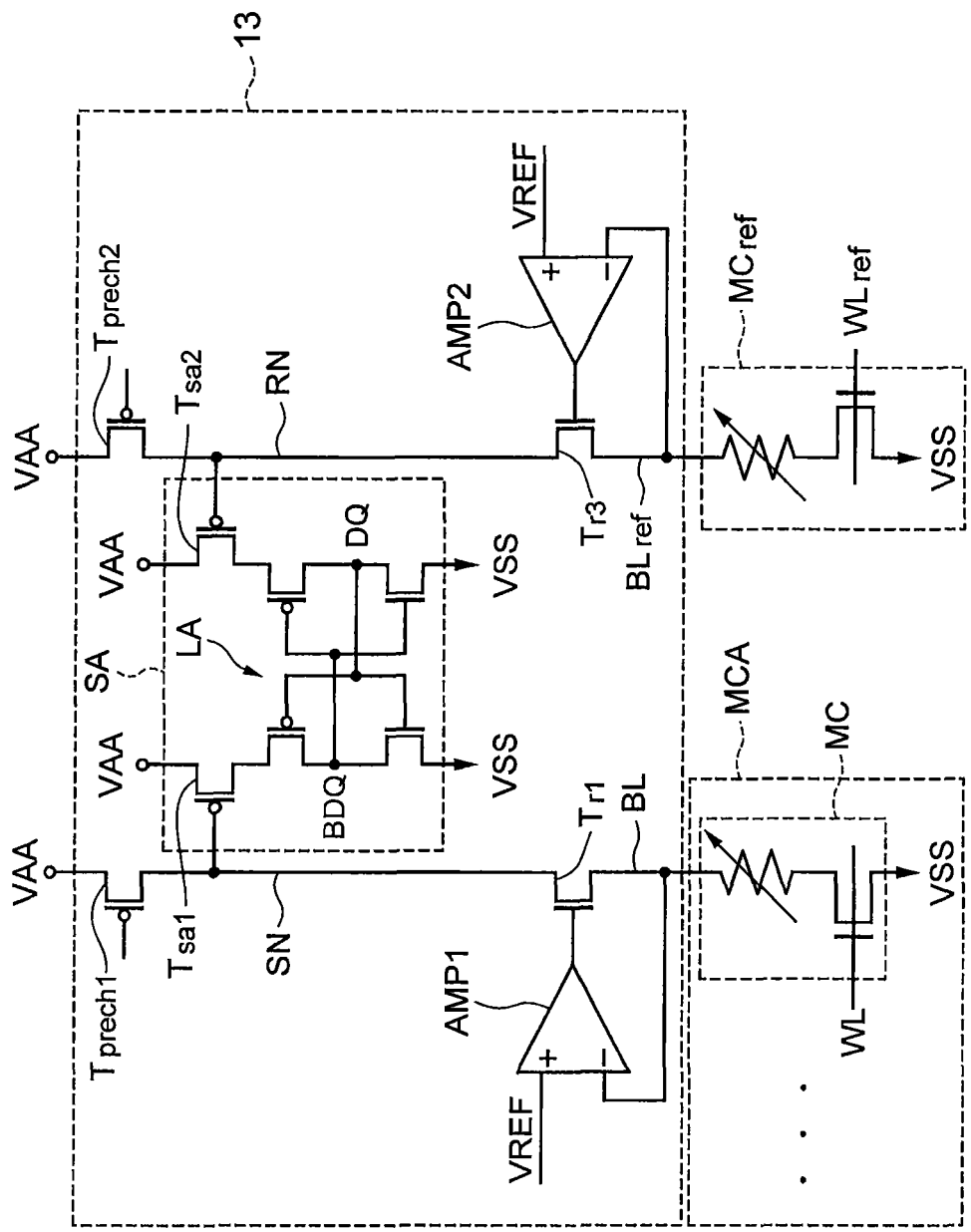
FIG. 12 is a circuit diagram showing an example of configurations of a read circuit 13, the memory cells MC, and the reference cell MCref of the memory 100 according to a ninth embodiment.

FIG. 12 is a circuit diagram showing an example of configurations of a read circuit 13, the memory cells MC, and the reference cell MCref of the memory 100 according to a ninth embodiment. A write circuit is provided separately from the read circuit 13 and is not shown in FIG. 12. The configurations of the memory cell MC and the memory cell array MCA can be identical to those in the first embodiment.

The read circuit 13 according to the ninth embodiment has a configuration obtained by eliminating a write circuit (the transistors Tr2, Tr4, Tr5, and Tr6) from the read/write circuit 10 shown in FIG. 4.

Other constituent elements of the read circuit 13 can be identical to those of the read/write circuit 10 according to the first embodiment. An internal configuration (the sense transistors Tsa1 and Tsa2 and the latch circuit LA) of the sense circuit SA of the read circuit 13 can be identical to that in the first embodiment. An operation of the read circuit 13 can be identical to the data read operation of the read/write circuit 10 according to the first embodiment.

For example, in the data read operation, the first and second precharge transistors Tprech1 and Tprech2 first become an on-state to precharge the sense node SN and the reference node RN in advance, respectively, and then become an off-state.

Before and after the first and second precharge transistors Tprech1 and Tprech2 are drove as described above, the reference voltage VREF is maintained to be set at a predetermined read voltage (0.5 volt, for example). This enables the first and second operational amplifiers AMP1 and AMP2 to control the conduction states of the first and third transistors Tr1 and Tr3 to keep the voltage of a bit line BL and the voltage of the reference bit line BLref at the read voltage (VREF), respectively.

Under control of the first operational amplifier AMP1, the first transistor Tr1 becomes a conduction state according to the output of the first operational amplifier AMP1. This connects the sense node SN to the bit line BL and the voltage of the sense node SN lowers at a rate corresponding to a resistance state (the Set state or the Reset state) of the relevant memory cell MC.

The sense circuit SA compares a voltage drop rate of the sense node SN with a voltage drop rate of the reference node RN and latches the logic of data of the memory cell MC. For example, when the voltage of the sense node SN lowers faster than the voltage of the reference node RN, the sense transistor Tsa1 becomes an on-state earlier than the sense transistor Tsa2, the node BDQ latches a logic high, and the node DQ latches a logic low. On the other hand, when the voltage of the reference node RN lowers faster than the voltage of the sense node SN, the sense transistor Tsa2 becomes an on-state earlier than the sense transistor Tsa1, the node DQ latches a logic high, and the node BDQ latches a logic low.

In this way, in the data read operation, the sense transistors Tsa1 and Tsa2 become the conduction states according to the voltage of the sense node SN based on the current flowing in the memory cell MC. The latch circuit LA latches logics corresponding to the conduction states of the sense transistors Tsa1 and Tsa2. This enables the sense circuit SA to autonomously (automatically) detect the logic of data in the memory cell MC and latch the logic.

(First Modification of Ninth Embodiment)

Figure 13:
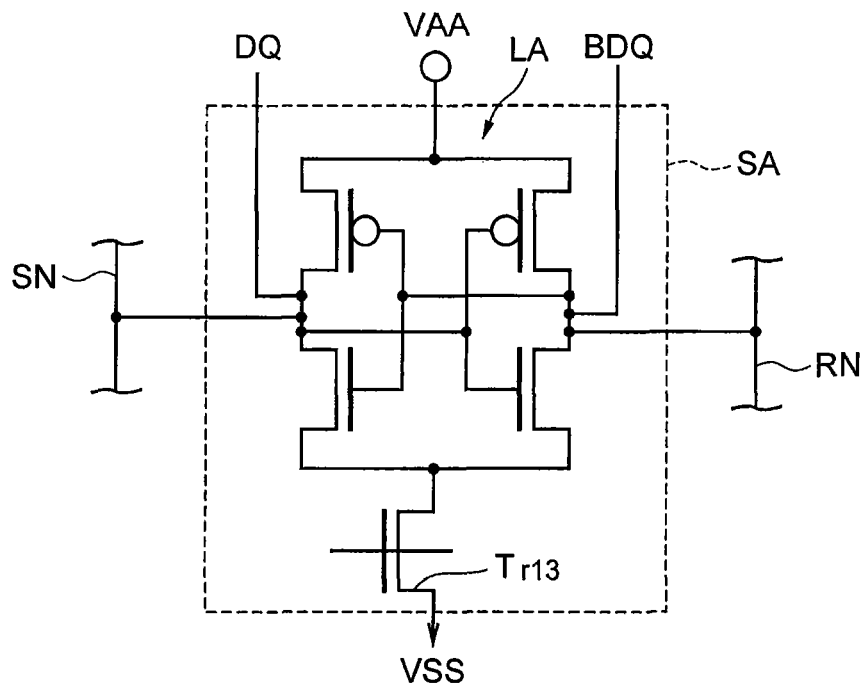
FIG. 13 is a circuit diagram showing an example of a configuration of the sense circuit SA of the memory 100 according to a first modification of the ninth embodiment.

FIG. 13 is a circuit diagram showing an example of a configuration of the sense circuit SA of the memory 100 according to a first modification of the ninth embodiment. The memory 100 according to the first modification is different from that according to the ninth embodiment in an internal configuration of the sense circuit SA. Other configurations of the first modification can be identical to those of the ninth embodiment.

In the first modification, the sense circuit SA includes the latch circuit LA and a thirteenth transistor Tr13. However, the sense circuit SA does not include the sense transistors Tsa1 and Tsa2. Therefore, the sense node SN and the reference node RN are connected directly to the nodes DQ and the BDQ of the latch circuit LA, respectively. In this case, a data logic of the sense node SN is latched at the node DQ and output therefrom and a data logic of the reference node RN is latched at the node BDQ and output therefrom.

The thirteenth transistor Tr13 is a transistor connected between the latch circuit LA and the voltage source VSS and being in an on-state in the data read operation.

The latch circuit LA latches a logic high at the node DQ and latches a logic low at the node BDQ when the voltage of the sense node SN is higher than that of the reference node RN. On the other hand, when the voltage of the sense node SN is lower than that of the reference node RN, the latch circuit LA latches a logic low at the node DQ and latches a logic high at the node BDQ. The data latched at the nodes DQ and BDQ can be output outside of the sense circuit SA.

In this way, in the data read operation, the sense circuit SA can latch the logics corresponding to the voltage of the sense node SN and the voltage of the reference node RN and output the logics from the nodes DQ and BDQ. That is, also when the sense node SN and the reference node RN are connected directly to the nodes DQ and BDQ of the latch circuit LA, respectively, an identical effect to that of the ninth embodiment can be achieved.

(Second Modification of Ninth Embodiment)

Figure 14:
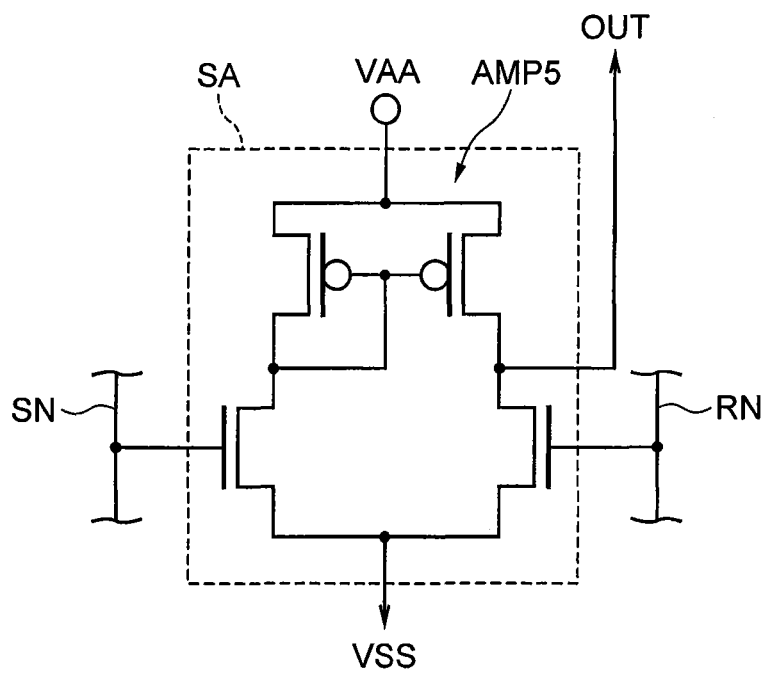
FIG. 14 is a circuit diagram showing an example of a configuration of the sense circuit SA of the memory 100 according to a second modification of the ninth embodiment.

FIG. 14 is a circuit diagram showing an example of a configuration of the sense circuit SA of the memory 100 according to a second modification of the ninth embodiment. The memory 100 according to the second modification is different from that according to the ninth embodiment in an internal configuration of the sense circuit SA. Other configurations of the second modification can be identical to those of the ninth embodiment.

In the second modification, the sense circuit SA includes a fifth operational amplifier AMP5. A non-inverting input of the fifth operational amplifier AMP5 is connected to the sense node SN and an inverting input thereof is connected to the reference node RN. That is, the fifth operation amplifier AMP5 is configured to output a data logic of the sense node SN.

The fifth operational amplifier AMP5 outputs a logic high from an output OUT when the voltage of the sense node SN is higher than that of the reference node RN. On the other hand, when the voltage of the sense node SN is lower than that of the reference node RN, the fifth operational amplifier AMP5 outputs a logic low from the output OUT. The data from the output OUT can be output outside of the sense circuit SA.

In this way, the sense circuit SA can output the logic corresponding to the voltage of the sense node SN and the voltage of the reference node RN in the data read operation. Accordingly, also when the fifth operational amplifier AMP5 is used as the sense circuit SA, an identical effect to that of the ninth embodiment can be achieved.

(Third Modification of Ninth Embodiment)

Figure 15:
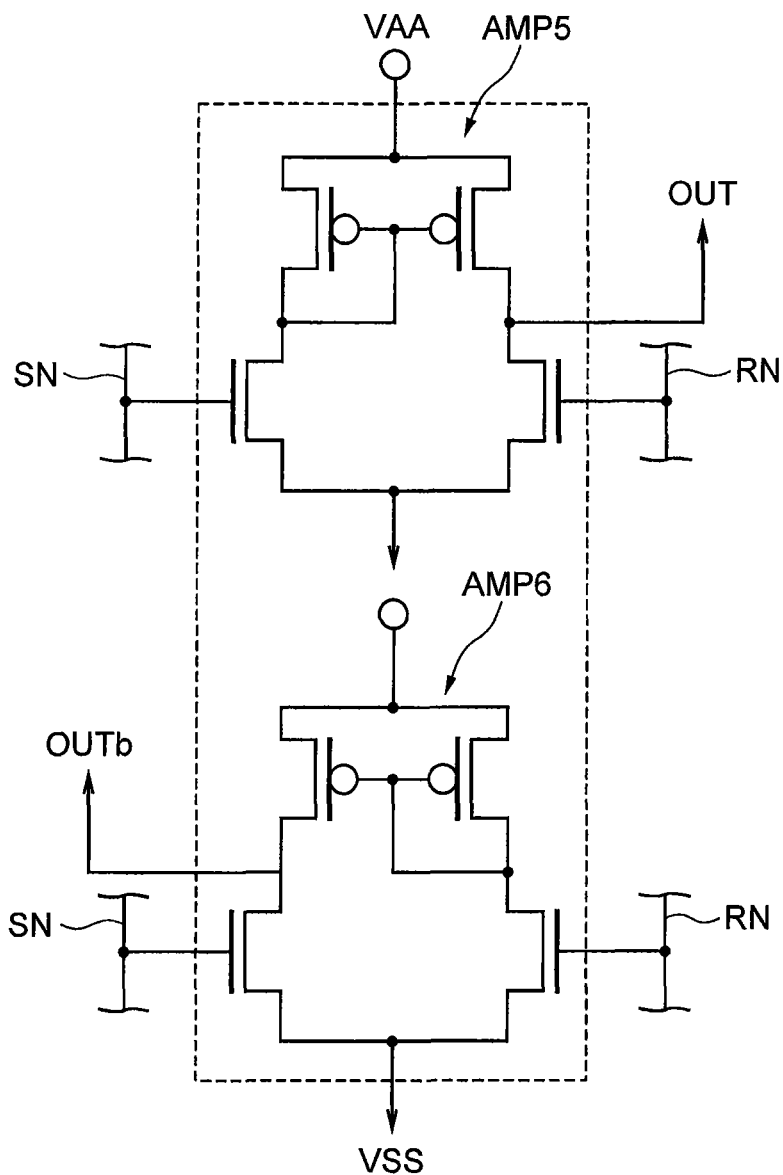
FIG. 15 is a circuit diagram showing an example of a configuration of the sense circuit SA of the memory 100 according to a third modification of the ninth embodiment.

FIG. 15 is a circuit diagram showing an example of a configuration of the sense circuit SA of the memory 100 according to a third modification of the ninth embodiment. The memory 100 according to the third modification is different from that according to the ninth embodiment in an internal configuration of the sense circuit SA. Other configurations of the third modification can be identical to those of the ninth embodiment.

In the third modification, the sense circuit SA includes the fifth operational amplifier AMP5 and a sixth operational amplifier AMP6. The non-inverting input of the fifth operational amplifier AMP5 is connected to the sense node SN and the inverting input thereof is connected to the reference node RN. That is, the fifth operational amplifier AMP5 is configured to output a data logic of the sense node SN. An inverting input of the sixth operational amplifier AMP6 is connected to the sense node SN and a non-inverting input thereof is connected to the reference node RN. That is, the sixth operational amplifier AMP6 is configured to output a data logic of the reference node RN (that is, an inverted logic of data of the sense node SN).

When the voltage of the sense node SN is higher than that of the reference node RN, the fifth operational amplifier AMP5 outputs a logic high from the output OUT and the sixth operational amplifier AMP6 outputs a logic low from an output OUTb. On the other hand, when the voltage of the sense node SN is lower than that of the reference node RN, the fifth operational amplifier AMP5 outputs a logic low from the output OUT and the sixth operational amplifier AMP6 outputs a logic high from the output OUTb. The data from the outputs OUT and OUTb can be output outside of the sense circuit SA.

In this way, the sense circuit SA can output the logic corresponding to the voltage of the sense node SN and the logic corresponding to the voltage of the reference node RN in the data read operation. Accordingly, also when the fifth and sixth operational amplifiers AMP5 and AMP6 are used as the sense circuit SA, an identical effect to that of the ninth embodiment can be achieved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device, comprising:
a first bit line;
a first word line;
a resistance-change memory element connected to the first bit line and the first word line;
a sense node connected to the first bit line in a data read operation;
a first transistor connected between the sense node and the first bit line;
a second transistor connecting the first bit line and a power supply to each other in a data write operation;
a first operational amplifier having one input connected to the first bit line, another input receiving a reference voltage, and an output connected to a gate of the first transistor; and
a sense circuit connected to the sense node, wherein
the output of the first operational amplifier is connected in common to the gate of the first transistor and a gate of the second transistor.

2. The device of claim 1, further comprising:
a second bit line;
a second word line;
a reference cell connected to the second bit line and the second word line;
a reference node connected to the second bit line in a data read operation;
a third transistor connected between the reference node and the second bit line; and
a second operational amplifier having one input connected to the second bit line, another input receiving the reference voltage, and an output connected to a gate of the third transistor, wherein
the sense circuit is connected between the sense node and the reference node.

3. The device of claim 2, further comprising a fourth transistor connecting the second bit line and a power supply to each other in a data write operation,
wherein the output of the second operational amplifier is connected in common to the gate of the third transistor and a gate of the fourth transistor.

4. The device of claim 2, wherein the first transistor connects the sense node to the first bit line and the third transistor connects the reference node to the second bit line in a data read operation.

5. The device of claim 3, wherein the second transistor connects the power supply to the first bit line and the fourth transistor connects the power supply to the second bit line in a data write operation.

6. The device of claim 3, wherein the first operational amplifier controls the first and second transistors to keep a voltage of the first bit line at the reference voltage and the second operational amplifier controls the third and fourth transistors to keep a voltage of the second bit line at the reference voltage in a data read operation and a data write operation.

7. The device of claim 1, wherein the second transistor connects the power supply to the first bit line and the first transistor connects the sense node to the first bit line in a data write operation.

8. The device of claim 3, wherein the fourth transistor connects the power supply to the second bit line and the third transistor connects the reference node to the second bit line in a data write operation.

9. The device of claim 1, further comprising a fifth transistor connected between the power supply and the second transistor,
wherein the fifth transistor is brought to a non-conduction state when a logic of data detected by the sense circuit is inverted in a data write operation.

10. The device of claim 3, further comprising a third operational amplifier having one input connected to the sense node and other input connected to the reference node.

11. The device of claim 10, further comprising:
a fifth transistor connected between the power supply and the second transistor; and
a first switching circuit connected between an output of the third operational amplifier and a gate of the fifth transistor, the first switching circuit bringing the fifth transistor to a non-conduction state when a logic of an output signal of the third operational amplifier is inverted in a data write operation.

12. The device of claim 10, further comprising:
a sixth transistor connected between the power supply and the fourth transistor; and
a second switching circuit connected between an output of the third operational amplifier and a gate of the sixth transistor, the second switching circuit bringing the sixth transistor to a non-conduction state when a logic of an output signal of the third operational amplifier is inverted in a data write operation.

13. The device of claim 2, wherein
the sense circuit further comprises a latch part connected to the sense node and the reference node, and
the latch part latches logics corresponding to a voltage of the sense node and a voltage of the reference node in a data read operation.

14. The device of claim 1,
wherein the sense circuit comprises:
a latch part including two P-type MOSFETs and two N-type MOSFETs;
a first sense transistor which is a P-type MOSFET connected between a power supply and the latch part, the first sense transistor having a gate connected to the sense node; and
a second sense transistor which is a P-type MOSFET connected between a power supply and the latch part, the second sense transistor having a gate connected to a reference node,
wherein a drain of the first sense transistor is connected to a source of one of the P-type MOSFETs of the latch part, and
wherein a drain of the second sense transistor is connected to a source of the other of the P-type MOSFETs of the latch part.

15. The device of claim 1,
wherein the sense circuit comprises:
a latch part including two P-type MOSFETs and two N-type MOSFETs;
a first sense transistor which is an N-type MOSFET connected between a power supply and the latch part, the first sense transistor having a gate connected to the sense node; and
a second sense transistor which is an N-type MOSFET connected between a power supply and the latch part, the second sense transistor having a gate connected to a reference node,
wherein a drain of the first sense transistor is connected to a source of one of the N-type MOSFETs of the latch part, and
wherein a drain of the second sense transistor is connected to a source of the other of the N-type MOSFETs of the latch part.

16. The device of claim 2, wherein
the sense circuit further comprises a fifth operational amplifier having one of inputs connected to the sense node, and
the fifth operational amplifier outputs a logic corresponding to a voltage of the sense node in a data read operation.

17. The device of claim 2, wherein
the sense circuit further comprises a fifth operational amplifier having one input connected to the sense node and other input connected to the reference node, and a sixth operational amplifier having one input connected to the sense node and other input connected to the reference node,
the fifth operational amplifier outputs a logic corresponding to a voltage of the sense node in a data read operation, and
the sixth operational amplifier outputs a logic corresponding to a voltage of the reference node in a data read operation.

18. The device of claim 1, wherein the first transistor is an N-type channel transistor.

19. The device of claim 1, wherein the first and second transistors have a same conductive-type channel.

20. A semiconductor storage device, comprising:
a first bit line;
a first word line;
a resistance-change memory element connected to the first bit line and the first word line;
a sense node connected to the first bit line in a data read operation;
a first transistor connected between the sense node and the first bit line;
a second transistor connecting the first bit line and a power supply to each other in a data write operation;
a first operational amplifier having one input connected to the first bit line, another input receiving a reference voltage, and an output connected to a gate of the first transistor and to a gate of the second transistor; and
a sense circuit connected to the sense node,
wherein the sense node is precharged before a read operation and is discharged at a rate depending on a condition of the resistance-change memory element during the read operation.

* * * * *